(12) United States Patent
Takai et al.

(10) Patent No.: US 10,677,963 B2
(45) Date of Patent: Jun. 9, 2020

(54) CURVED SUBSTRATE WITH FILM, METHOD FOR PRODUCING THE SAME, AND IMAGE DISPLAY DEVICE

(71) Applicant: AGC Inc., Chiyoda-ku (JP)

(72) Inventors: Azusa Takai, Tokyo (JP); Yusuke Kobayashi, Tokyo (JP); Kazunobu Maeshige, Tokyo (JP); Takaaki Murakami, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 281 days.

(21) Appl. No.: 15/797,758

(22) Filed: Oct. 30, 2017

(65) Prior Publication Data

US 2018/0052254 A1    Feb. 22, 2018

Related U.S. Application Data

(63) Continuation of application No. PCT/JP2016/083839, filed on Nov. 15, 2016.

(30) Foreign Application Priority Data

Nov. 20, 2015 (JP) .................................. 2015-227440
Mar. 14, 2016 (JP) .................................. 2016-049747

(51) Int. Cl.
*G02B 1/11* (2015.01)
*B05D 1/04* (2006.01)
(Continued)

(52) U.S. Cl.
CPC .............. *G02B 1/11* (2013.01); *B05B 5/0407* (2013.01); *B05B 5/084* (2013.01); *B05D 1/04* (2013.01);
(Continued)

(58) Field of Classification Search
CPC ........... G02B 1/11–1/118; G02B 5/208; G02B 5/281; G02B 5/282; G02B 5/02–5/0294;
(Continued)

(56) References Cited

U.S. PATENT DOCUMENTS 5,958,134 A * 9/1999 Yasar ...................... B24B 3/48
                                                        118/50
2004/0228141 A1   11/2004 Hay et al.
(Continued)

FOREIGN PATENT DOCUMENTS

JP          52-15534          2/1977
JP          62-75619          4/1987
(Continued)

OTHER PUBLICATIONS

JP 52-015534 A, English Language Machine Translation, created Oct. 17, 2019 (Year: 1977).*
(Continued)

*Primary Examiner* — Stephone B Allen
*Assistant Examiner* — Adam W Booher
(74) *Attorney, Agent, or Firm* — Oblon, McClelland, Maier & Neustadt, L.L.P.

(57) ABSTRACT

A curved substrate with a film includes a substrate having a first main surface, a second main surface and an end surface, and an antiglare film provided on the first main surface. The substrate has a flat portion and a bent portion. A value obtained by dividing a reflected-image diffusibility index value R of the bent portion by the sum of the reflected-image diffusibility index value R of the bent portion and a reflected-image diffusibility index value R of the flat portion is 0.3 or higher and 0.8 or less.

5 Claims, 9 Drawing Sheets

(51) Int. Cl.
| | |
|---|---|
| *B32B 7/02* | (2019.01) |
| *C03C 17/34* | (2006.01) |
| *B05B 5/08* | (2006.01) |
| *C03C 17/25* | (2006.01) |
| *B05D 5/06* | (2006.01) |
| *C03C 3/087* | (2006.01) |
| *G02B 5/02* | (2006.01) |
| *C03C 3/076* | (2006.01) |
| *C03C 3/085* | (2006.01) |
| *B05B 5/04* | (2006.01) |
| *C23C 14/08* | (2006.01) |
| *C23C 14/10* | (2006.01) |
| *C23C 14/34* | (2006.01) |
| *B05B 3/10* | (2006.01) |
| *B05D 3/02* | (2006.01) |
| *B05B 16/00* | (2018.01) |
| *B05B 13/02* | (2006.01) |
| *B05B 15/68* | (2018.01) |
| *B05B 13/04* | (2006.01) |
| *B05B 15/58* | (2018.01) |
| *B05B 14/40* | (2018.01) |
| *G02B 1/115* | (2015.01) |
| *G02B 5/20* | (2006.01) |

(52) U.S. Cl.
CPC ............ *B05D 1/045* (2013.01); *B05D 5/061* (2013.01); *B32B 7/02* (2013.01); *C03C 3/076* (2013.01); *C03C 3/085* (2013.01); *C03C 3/087* (2013.01); *C03C 17/25* (2013.01); *C03C 17/3417* (2013.01); *C23C 14/083* (2013.01); *C23C 14/10* (2013.01); *C23C 14/3464* (2013.01); *G02B 5/0226* (2013.01); *G02B 5/0268* (2013.01); *G02B 5/0284* (2013.01); *G02B 5/0294* (2013.01); *B05B 3/1064* (2013.01); *B05B 5/0411* (2013.01); *B05B 5/0426* (2013.01); *B05B 13/0278* (2013.01); *B05B 13/0457* (2013.01); *B05B 14/40* (2018.02); *B05B 15/58* (2018.02); *B05B 15/68* (2018.02); *B05B 16/95* (2018.02); *B05D 3/0254* (2013.01); *B05D 2203/35* (2013.01); *B05D 2601/20* (2013.01); *B32B 2307/40* (2013.01); *C03C 2217/213* (2013.01); *C03C 2217/732* (2013.01); *C03C 2217/734* (2013.01); *C03C 2218/115* (2013.01); *G02B 1/115* (2013.01); *G02B 5/208* (2013.01)

(58) Field of Classification Search
CPC ............ B05D 1/04–1/06; C23C 14/083; C23C 14/10; C23C 14/3464; C23C 14/56; B23B 2307/40; G02F 1/133502; G02F 1/133509; G02F 2001/133519; G02F 2001/13521
See application file for complete search history.

(56) References Cited

U.S. PATENT DOCUMENTS

| | | |
|---|---|---|
| 2006/0056031 A1 | 3/2006 | Capaldo et al. |
| 2006/0114569 A1 | 6/2006 | Capaldo et al. |
| 2007/0154721 A1 | 7/2007 | Wang et al. |
| 2008/0131625 A1 | 6/2008 | Hay et al. |
| 2009/0104385 A1 | 4/2009 | Reymond et al. |
| 2011/0019278 A1* | 1/2011 | Aoki ............... G02B 5/223 359/585 |
| 2012/0064225 A1* | 3/2012 | Bachrach ........ H01M 4/0419 427/58 |
| 2013/0260482 A1* | 10/2013 | Iida ............... H01L 41/318 438/3 |
| 2015/0226882 A1* | 8/2015 | Sahara ............ B32B 17/064 359/601 |
| 2016/0054476 A1* | 2/2016 | Choi ............... G02B 1/115 428/148 |
| 2016/0291543 A1* | 10/2016 | Saito ............... G03H 1/0248 |
| 2017/0021383 A1* | 1/2017 | Takai ............... B05D 5/06 |
| 2017/0139082 A1 | 5/2017 | Takai et al. |
| 2018/0052254 A1 | 2/2018 | Takai et al. |
| 2018/0185875 A1* | 7/2018 | Murakami ......... C03C 17/3417 |

FOREIGN PATENT DOCUMENTS

| | | |
|---|---|---|
| JP | 2006-113145 | 4/2006 |
| JP | 2007-183562 A | 7/2007 |
| JP | 2007-528508 | 10/2007 |
| JP | 2009-58640 | 3/2009 |
| JP | 2009-529715 A | 8/2009 |
| JP | 2015-121512 | 7/2015 |
| JP | 2015-152691 | 8/2015 |
| WO | WO 2015/125929 A1 | 8/2015 |
| WO | WO 2015/133346 A1 | 9/2015 |
| WO | WO 2016/021560 A1 | 2/2016 |
| WO | WO 2017/086316 A1 | 5/2017 |

OTHER PUBLICATIONS

International Search Report dated Feb. 14, 2017 in PCT/JP2016/083839, filed on Nov. 15, 2016 (with English Translation).
Written Opinion dated Feb. 14, 2017 in PCT/JP2016/083839, filed on Nov. 15, 2016.

* cited by examiner

CURVED SUBSTRATE WITH FILM, METHOD FOR PRODUCING THE SAME, AND IMAGE DISPLAY DEVICE

TECHNICAL FIELD

The present invention relates to a curved substrate with a film, a method for producing the same, and an image display device.

BACKGROUND ART

In image display devices (e.g., liquid-crystal displays, organic EL displays, plasma displays, etc.) provided to various appliances (e.g., televisions, personal computers, smartphones, mobile phones, etc.), if external light such as light from indoor illuminators (e.g., fluorescent lamps) or sunlight is reflected in the screens, the visibility is reduced by the reflected images. In recent years, image display devices having a curved or bent screen are coming to be used, and inhibition of the reflection in the screen has become more important.

As a method for inhibiting the reflection of external light, there is a method in which an antiglare film having a surface with a rugged structure is disposed on a screen of an image display device to diffusedly reflect external light to thereby blur the reflected image.

Known as a method for forming an antiglare film is a method in which a composition containing a silica precursor such as a hydrolysis and condensation product of an alkoxysilane is applied to a substrate by spraying and fired (see, for example, Patent Document 1). In the case of forming an antiglare film by spraying, a two-fluid spray nozzle is frequently used.

However, it is necessary, for forming a homogeneous antiglare film, to employ a robot for scanning with the two-fluid spray nozzle, resulting in an increased cost and a prolonged coating period. In addition, the antiglare film thus obtained has insufficient homogeneity, and it has been difficult to obtain desired properties.

Meanwhile, Patent Document 2 proposes a method in which a surfactant is incorporated into a composition to render the liquid easy to spread and this composition is applied to a curved or bent substrate. There is a problem in that since a surfactant is used in a large amount to regulate the makeup of the composition so as to attain desired surface tension, not only an antiglare film having desired optical properties is not obtained but also the antiglare film thus obtained has insufficient optical evenness.

Patent Document 3 discloses a method for producing a curved substrate with an antiglare film, the method including steps of forming on a flat glass plate an antiglare film having a higher glass transition temperature than the flat glass plate and then forming a bent portion in the flat glass plate at an elevated temperature to produce a curved substrate with an antiglare film. The method in which the flat glass plate having an antiglare film formed thereon is shaped to form a bent portion in a part of the glass plate has a problem in that the flat portion and the bent portion differ in appearance. This is because the glass plate on which an antiglare film has been formed is exposed to a high temperature during the molding, in particular, an area where a bent portion is to be formed is heated to a temperature higher than that of the flat portion, and this heating damages a structure of the antiglare film. Furthermore, since an antiglare film having a glass transition temperature higher than the flat glass plate is formed, there is a problem in that in the molding step, the antiglare film itself has insufficient flexibility and a large number of defects, such as cracks, occur.

In addition, there is a problem in that the presence of an antireflection film disposed on a curved substrate results in differences in reflected-light color tone depending on a direction of viewing. There has been a problem in that in cases where a viewer views the display device from a position directly opposite to the screen, the screen has different color tones depending on portions of the curved substrate (see, for example, Patent Document 4).

PRIOR ART DOCUMENTS

Patent Documents

Patent Document 1: JP-A-2009-058640
Patent Document 2: JP-A-2006-113145
Patent Document 3: International Publication WO 2015/133346
Patent Document 4: JP-A-2015-121512

SUMMARY OF THE INVENTION

Problems that the Invention is to Solve

An object of the present invention, in view of the problems described above, is to provide a curved substrate with a film which has a highly beautiful appearance and in-plane evenness and renders excellent visibility possible, and to provide a method for producing the curved substrate with a film and an image display device.

A curved substrate with a film according to an embodiment of the present invention includes a substrate having a first main surface, a second main surface and an end surface, and an antiglare film provided on the first main surface, wherein the substrate has a flat portion and a bent portion and a value obtained by dividing a reflected-image diffusibility index value R of the bent portion by the sum of the reflected-image diffusibility index value R of the bent portion and a reflected-image diffusibility index value R of the flat portion is 0.3 or higher and 0.8 or less.

The reflected-image diffusibility index value R is determined by irradiating the substrate with light from a direction of +45° with respect to the first main surface of the substrate as a reference (taken as 0°) to measure a luminance of regular-reflection light reflected by a substrate surface (referred to as 45° regularly reflected light), subsequently similarly irradiating the substrate with the light from the direction of +45° to measure the luminance of all reflected light reflected by the substrate surface, while changing a light-receiving angle in a range of 0° to +90°, and calculating the reflected-image diffusibility index value R using the following equation (1).

$$R=[(\text{luminance of all reflected light})-(\text{luminance of 45}° \text{ regularly reflected light})]/(\text{luminance of all reflected light}) \quad (1).$$

A curved substrate with a film according to another embodiment of the present invention includes a substrate having a first main surface, a second main surface and an end surface, and an antiglare film provided on the first main surface, wherein the substrate consists of a curved portion having a curvature of not 0 throughout and the antiglare film provided on the bent portion has an in-plane standard deviation of haze of 0% or higher and 10% or less.

A method for producing a curved substrate with a film according to an embodiment of the present invention includes a step of preparing a curved substrate comprising a first main surface, a second main surface and an end surface, and having a bent portion, a step of preparing a composition comprising at least one of a silica precursor (A) and particles (C) and further comprising a liquid medium (B), a step of disposing the curved substrate on a conductive base so that the bent portion of the second main surface comes into contact with the conductive base, a step of forming a coating film on the curved substrate disposed on the conductive base by using an electrostatic coating apparatus to charge and spray the composition, and a step of firing the coating film.

Effects of the Invention

The present invention is capable of providing a curved substrate with a film which has a highly beautiful appearance and in-plane evenness and renders excellent visibility possible, a method for producing the curved substrate with a film, and an image display device.

BRIEF DESCRIPTION OF THE DRAWINGS

FIG. 1A illustrates a curved substrate with a film having a shape including a bent portion and a flat portion in combination, and FIG. 1B illustrates a curved substrate with a film having a shape constituted only of a bent portion.

FIG. 2A illustrates a curved substrate having a shape including a bent portion and a flat portion in combination, and FIG. 2B illustrates a curved substrate having a shape constituted only of a bent portion.

FIG. 7A is a schematic perspective view, and FIG. 7B is a schematic cross-sectional view showing the cross-section A-A.

FIG. 8A is a plan view, and FIG. 8B is a side view.

MODES FOR CARRYING OUT THE INVENTION

Figure 1A:
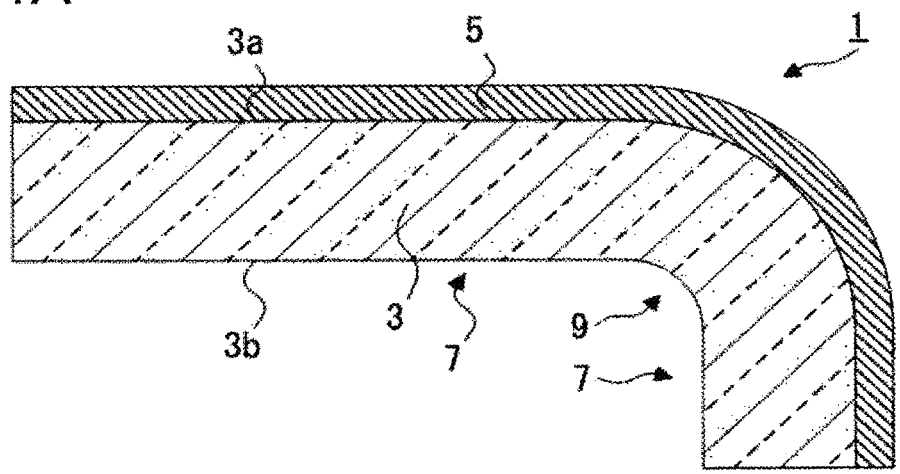
FIG. 1A and FIG. 1B are schematic cross-sectional views of examples of a curved substrate with a film according to an embodiment of the present invention.

The following definitions of terms apply throughout this description and the claims.

The term "bent portion" means a portion having an average curvature of not zero.

The term "silica precursor" means a substance which, upon firing, can form a matrix including $SiO_2$ as a main component.

The wording "including $SiO_2$ as a main component" means that $SiO_2$ is contained in an amount of 90 mass % or larger.

The term "hydrolyzable group bonded to a silicon atom" means a group which can be converted, upon hydrolysis, into an OH group bonded to the silicon atom.

The term "flaky particles" means particles having a flat shape. The shape of particles can be ascertained using a transmission electron microscope (hereinafter referred to also as TEM).

"60° mirror surface glossiness" is measured by the method described in JIS Z8741: 1997 (ISO2813:1994), without eliminating reflection occurring on the back surface (the surface on the side opposite to the side where the antiglare film has been formed).

"Haze" is measured by the method described in JIS K7136: 2000 (ISO14782: 1999).

"Arithmetic average roughness Ra" is determined by the method described in JIS B0601: 2001 (ISO4287: 1997).

The term "average particle diameter" means a particle diameter at the point of 50% in a cumulative volume distribution curve wherein the total volume of the particle size distribution determined on a volume basis is taken as 100%, i.e., a volume-cumulative 50% diameter (D50). The particle size distribution is determined from a frequency distribution and a cumulative volume distribution curve both determined by a measurement with a laser diffraction/scattering type particle size distribution analyzer.

The "bearing height" is the value of a most prominent height z in a height distribution histogram obtained by examining an area of from 101 μm×135 μm to 111 μm×148 μm (hereinafter referred to also as "examination area") with a laser microscope and determining the histogram from the resultant xyz data on the surface shape of the examination area. The height z in the xyz data is the height from a lowest point as a reference in the examination area (the height being the length of a perpendicular drawn from the position where the height z is to be measured to a plane which is parallel with the main surface of the substrate in the examination area and which includes the lowest point). Hereinafter, in the case where no reference is especially specified, the term "height in a surface shape" has the same meaning. When calculating the bearing height, the bin of the histogram was set at 1,000.

The term "aspect ratio" means a ratio of a maximum length to the thickness (maximum length/thickness) of a particle. "Average aspect ratio" is an average of aspect ratios of 50 particles selected randomly. The thickness of a particle is measured with an atomic force microscope (hereinafter referred to also as AFM), and the maximum length is measured with a TEM.

A "reflected-image diffusibility index value R" is calculated by the following method. First, the substrate is irradiated with light from a direction of +45° with respect to a substrate surface as a reference (taken as 0°) to measure a luminance of regular-reflection light reflected by the substrate surface (referred to as 45° regularly reflected light). Subsequently, the substrate is similarly irradiated with the light from the direction of +45° to measure the luminance of all reflected light reflected by the substrate surface, while changing a light-receiving angle in a range of 0° to +90°. These measured values are substituted into the equation:

Reflected-image diffusibility index value R=[(luminance of all the reflected light)−(luminance of 45° regularly reflected light)]/(luminance of all the reflected light). Thus, the reflected-image diffusibility index value R is determined.

A "resolution index value T" is calculated by the following method. The substrate to be examined, which has a first main surface and a second main surface, is irradiated with first light from a second main surface side along a direction parallel with a thickness direction of the substrate (referred to as "angle-0° direction") to measure a luminance of light transmitted through the first main surface (referred to as "0° transmitted light"). Subsequently, the luminance of all the light transmitted through the first main surface is measured while changing a light-receiving angle in a range of −90° to +90° with respect to the first main surface. These measured values are substituted into the equation: Resolution index value T=[(luminance of all the transmitted light)−(luminance of 0° transmitted light)]/(luminance of all the transmitted light). Thus, the resolution index value T is determined.

A "sparkle index value S" is determined in the following manner. The substrate to be examined, which has a first main surface and a second main surface, is disposed in a desired display device so that the second main surface is on a display surface side. Next, the substrate is photographed from a first main surface side to acquire an image. This image is analyzed with software EyeScale-4 W (manufactured by I System Corp.), and the value of ISC-A outputted thereby was taken as the sparkle index value S.

Figure 1B:
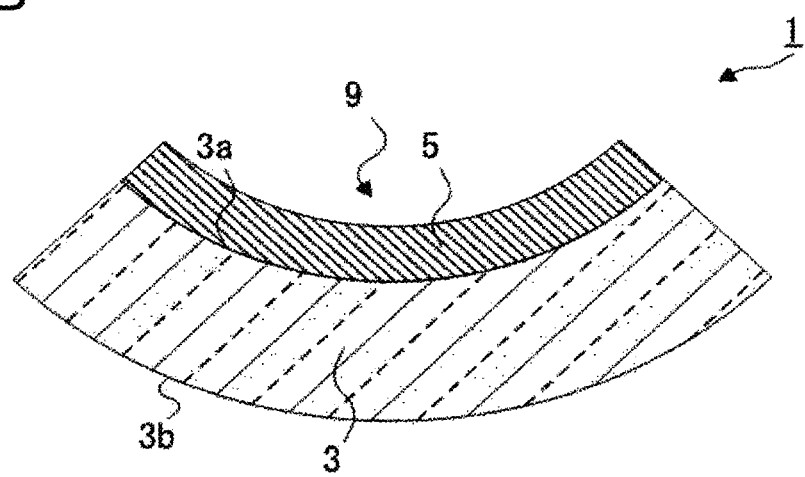

Curved substrate with an antiglare films (hereinafter referred to also as "curved substrate with a film") obtained by the method for producing a curved substrate with an antiglare film as an embodiment of the present invention each includes a curved substrate and an antiglare film formed on the curved substrate. FIG. 1A and FIG. 1B are schematic cross-sectional views showing examples of a curved substrate with an antiglare film obtained by a production method according to an embodiment of the present invention.

The curved substrate with an antiglare film 1 shown as an example includes a curved substrate 3 having a bent portion 9 and an antiglare film 5 formed on the curved substrate 3. FIG. 1A shows a shape including a bent portion 9 and a flat portion 7 in combination, and FIG. 1B shows a shape wholly constituted of a bent portion 9.

<Curved Substrate>

Figure 2A:
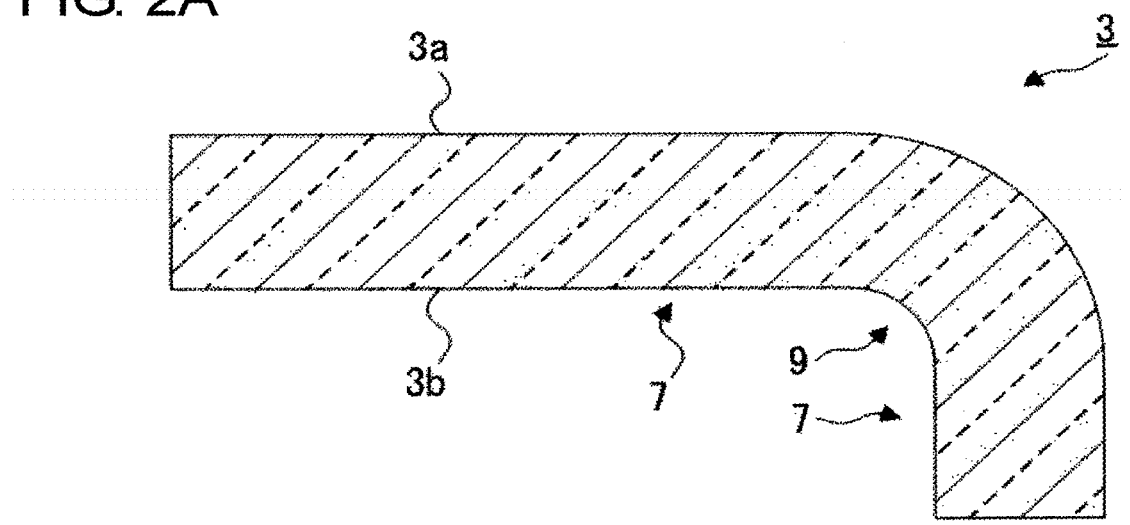
FIG. 2A and FIG. 2B are schematic cross-sectional views of examples of curved substrates.
Figure 2B:
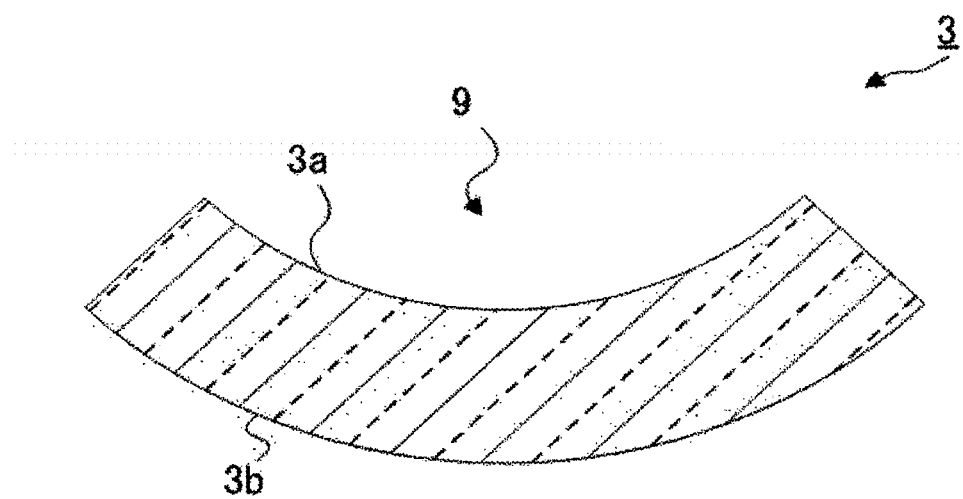

The curved substrate 3 has a shape which has a first main surface 3a, a second main surface 3b, and an end surface and is provided with at least one or more bent portion 9. Examples thereof include a shape having a bent portion 9 and a flat portion 7 in combination, such as that shown in FIG. 2A and a shape which is wholly constituted of a bent portion 9, such as that shown in FIG. 2B. However, the shape of the curved substrate is not particularly limited so long as the curved substrate has a bent portion 9. Various appliances (e.g., televisions, personal computers, smartphones, and car navigation systems) employing image display devices in which the screens have a curved surface have come to appear recently, and the curved substrate 3 may be produced so as to have a shape according to the shape of such an image display device, the shape of the housing of the image display device, etc.

Examples of a form of the curved substrate 3 include plates, films, etc.

Examples of a material of the curved substrate 3 include a glass, a metal, a resin, a silicone, wood, and paper. Examples of the resin include poly(ethylene terephthalate), polycarbonate, triacetyl cellulose, and poly(methyl methacrylate). Of these, a glass is preferred from the standpoints of safety and strength. For use as vehicle-mounted substrates, a glass is preferred also from the standpoints of high heat resistance and high weatherability.

In the case where the curved substrate 3 is a glass, it is preferable that the curved substrate 3 should have undergone a strengthening treatment, from the standpoint of ensuring the mechanical strength and scratch resistance which are required of cover glasses for use as vehicle-mounted display members. As the strengthening treatment, either a physical strengthening treatment or a chemical strengthening treatment can be used. However, a chemical strengthening treatment is preferred because relatively thin glasses can also be strengthened thereby.

With respect to the glass composition of the curved substrate 3, examples thereof include alkali-free glasses and soda-lime glasses for the case where no chemical strengthening treatment is performed, and include soda-lime silicate glasses, aluminosilicate glasses, borate glasses, lithium aluminosilicate glasses, and borosilicate glasses for the case where a chemical strengthening treatment is performed. Aluminosilicate glasses are preferred from the standpoints that it is easy to introduce large stress by a strengthening treatment even when the glass thickness is small and a glass which is thin but has high strength is obtained and that this glass is hence suitable as the object to be disposed on the viewing side in image display devices.

The curved substrate 3 has a maximum surface compressive stress value of 400 MPa or higher, preferably 500 MPa or higher, more preferably 600 MPa or higher. The depth of the compressive stress layer (DOL) is 10 μm or larger. By regulating the surface compressive stress and the depth of the surface compressive stress layer so as to be within the ranges, excellent strength and scratch resistance can be imparted to the main surfaces of the curved substrate 3.

[Glass Compositions]

Examples of the glass composition of the curved substrate 3 include a glass which includes, represented by mole %, from 50 to 80% of $SiO_2$, from 0.1 to 25% of $Al_2O_3$, from 3 to 30% of $Li_2O+Na_2O+K_2O$, from 0 to 25% of MgO, from 0 to 25% of CaO, and from 0 to 5% of $ZrO_2$. However, the glass composition thereof is not particularly limited. More specifically, the following glass compositions are mentioned. Incidentally, for example, the wording "containing from 0 to 25% of MgO" means that MgO, although not essential, may be contained in an amount of up to 25%. The glass (i) falls under the soda-lime silicate glasses, and the glasses (ii) and (iii) fall under the aluminosilicate glasses.

(i) A glass including, represented by mole %, from 63 to 73% of $SiO_2$, from 0.1 to 5.2% of $Al_2O_3$, from 10 to 16% of $Na_2O$, from 0 to 1.5% of $K_2O$, from 0 to 5.0% of $Li_2O$, from 5 to 13% of MgO, and from 4 to 10% of CaO;

(ii) A glass which includes, represented by mole %, from 50 to 74% of $SiO_2$, from 1 to 10% of $Al_2O_3$, from 6 to 14% of $Na_2O$, from 3 to 11% of $K_2O$, from 0 to 5.0% of $Li_2O$, from 2 to 15% of MgO, from 0 to 6% of CaO, and from 0 to 5% of $ZrO_2$, and in which the total content of $SiO_2$ and $Al_2O_3$ is 75% or less, the total content of $Na_2O$ and $K_2O$ is from 12 to 25%, and the total content of MgO and CaO is from 7 to 15%;

(iii) A glass including, represented by mole %, from 68 to 80% of $SiO_2$, from 4 to 10% of $Al_2O_3$, from 5 to 15% of $Na_2O$, from 0 to 1% of $K_2O$, from 0 to 5.0% of $Li_2O$, from 4 to 15% of MgO, and from 0 to 1% $ZrO_2$;

(iv) A glass which includes, represented by mole %, from 67 to 75% $SiO_2$, from 0 to 4% of $Al_2O_3$, from 7 to 15% of $Na_2O$, from 1 to 9% of $K_2O$, from 0 to 5.0% of $Li_2O$, from 6 to 14% of MgO, and from 0 to 1.5% of $ZrO_2$, and in which the total content of $SiO_2$ and $Al_2O_3$ is from 71 to 75% and the total content of $Na_2O$ and $K_2O$ is from 12 to 20%, and when CaO is contained, the content thereof is less than 1%.

It is preferable that the total content of $Li_2O$ and $Na_2O$ in the glass composition of the curved substrate 3 should be 12 mole % or higher from the standpoint of properly performing a chemical strengthening treatment. Furthermore, since the glass decreases in glass transition point and becomes easier to shape as the $Li_2O$ content in the glass composition increases, the content of $Li_2O$ is regulated to preferably 0.5 mole % or higher, more preferably 1.0 mole % or higher, even more preferably 2.0 mole % or higher. Moreover, from the standpoint of increasing the surface compressive stress (CS) and the depth of the compressive stress layer (depth of layer: DOL), it is preferable that the glass composition of the curved substrate 3 should contain 60 mole % or higher of $SiO_2$ and 8 mole % or higher of $Al_2O_3$.

[Process for Producing Glass]

Next, a method for producing a flat plate glass for producing a curved substrate 3 therefrom is explained. First, raw materials for the components are mixed so as to result in any of the compositions described above, and the mixture is heated and melted in a glass melting furnace. The glass is homogenized by bubbling, stirring, addition of a refining agent, etc., formed into a glass plate having a given thickness by a known molding process, and then cooled slowly. Examples of glass molding processes include a float process, a pressing process, a fusion process, a downdraw process, and a rolling-out process. Especially suitable is the float process, which is suitable for mass production. Also suitable are a continuous molding process other than the float process, i.e., the fusion process and the downdraw process. The glass member formed into a flat plate shape by any desired molding process is cooled slowly and then cut into a desired size. In the case, for example, where higher dimensional accuracy is required, the glass member which has undergone the cutting may be subjected to the polishing or edge processing which will be described later. Thus, breakage or chipping can be diminished in the handling of the glass member in the molding step, etc., resulting in an improvement in yield.

(Molding Step)

It is preferable that a curved substrate 3 should be obtained by molding a substrate of a flat plate shape into a given shape. For example, in the case where a plate glass has been selected as the substrate of a flat plate shape, a desired molding process to be used may be selected from a gravity molding process, a vacuum molding process, and a press molding process, in accordance with the shape of the curved substrate 3 to be obtained through the molding.

The gravity molding process is a process in which a plate glass is disposed on a given mold according to the shape of the curved substrate 3 to be obtained through the molding, and the plate glass is thereafter softened and caused to gravitationally bend and conform to the mold, thereby molding the plate glass into the given shape.

The vacuum molding process is a process in which a differential pressure is given to the front and back surfaces of a plate glass in a softened state to cause the plate glass to conform to a mold, thereby molding the plate glass into a given shape. In the vacuum molding process, a plate glass is disposed on a given mold according to the shape of the curved substrate 3 to be obtained through the molding, and a clamp mold is disposed on the plate glass. After a periphery of the plate glass is sealed, the space between the mold and the plate glass is evacuated with a pump to thereby give a differential pressure to the front and back surfaces of the plate glass. In this operation, the upper surface side of the plate glass may be pressurized in aid.

The press forming is a process in which a plate glass is disposed between given mold halves (lower half and upper half) according to the shape of the curved substrate 3 to be obtained through the molding, and a pressing load is applied to between the upper and lower mold halves, while keeping the plate glass in a softened state. The plate glass is thus caused to bend and conform to the mold halves, thereby molding the plate glass into the given shape.

Of these processes, the vacuum molding process is an excellent method for molding into a given shape of the curved substrate 3. Since the plate glass can be shaped while preventing one of the two main surfaces of the curved substrate 3 from coming into contact with the mold, this method is effective in diminishing rugged defects such as scratches and recesses.

A suitable molding process may be selected in accordance with the shape of the curved substrate 3 to be obtained through molding. Two or more molding processes may be used in combination.

The substrate of a flat plate shape to be used may be a substrate having an etched layer, a coating layer formed by wet coating or dry coating, etc.

(Polishing Step)

At least one main surface of the work, such as either the substrate of a flat plate shape which is to be shaped into a curved substrate 3 or the curved substrate 3 obtained through molding, may be polished.

In the polishing step, the polishing part of a rotary polishing tool is brought into contact with the substrate at a constant pressure and is moved thereon at a constant speed to polish the surface. By performing the polishing under the conditions of a constant pressure and a constant speed, the surface to be polished can be evenly polished at a constant polishing rate. The pressure at which the polishing part of the rotary polishing tool is kept in contact is preferably from 1 to 1,000,000 Pa from the standpoints of profitability, ease of control, etc. The speed is preferably from 1 to 10,000 mm/min from the standpoints of profitability, ease of control, etc. The amount of movement is suitably determined in accordance with the shape of the substrate, etc. The rotary polishing tool is not particularly limited so long as the polishing part thereof is a rotating object capable of polishing. Examples thereof include a spindle having a tool-chucking part and a polishing tool of the type mounted on a router. With respect to the material of the rotary polishing tool, the kind thereof is not particularly limited so long as at least the polishing part thereof is made of a material capable of polishing away the work, such as a cerium pad, rubber grindstone, felt buff, or polyurethane, and has a Young's modulus of preferably 7 GPa or less, more preferably 5 GPa or less. By using a member having a Young's modulus of 7 GPa or less as the material of the rotary polishing tool, the polishing part can be deformed by pressure so as to conform to the shape of the work and the bottom surface and side surfaces can be processed to the given surface roughness shown above. Examples of the shape of the polishing part of the rotary polishing tool include a circular or doughnut-shaped flat disk, a cylindrical shape, a cannonball shape, a disk shape, and a barrel shape.

In the case where a substrate is polished while keeping the polishing part of a rotary polishing tool in contact with the substrate, it is preferred to conduct the processing in the presence of an abrasive grain slurry. In this case, examples of the abrasive grains include silica, ceria, alundum, white alundum (WA), emery, zirconia, SiC, diamond, titania, and germania, and the grain sizes thereof are preferably from 10 nm to 10 µm. The speed of relative movement of the rotary polishing tool can be selected in the range of from 1 to 10,000 mm/min as stated above. The rotational speed of the polishing part of the rotary polishing tool is from 100 to 10,000 rpm. Too low rotational speeds may result in a reduced proceeding rate and too long a period required for obtaining a desired surface roughness. Too high rotational speeds may result in too high a processing rate and enhanced tool wear, making it difficult to control the polishing.

The substrate may be polished while moving the rotary polishing tool and the substrate relative to each other so that the rotary polishing tool moves along the shape of the substrate. The mode of movement is not limited, and any mode capable of controlling the amount of movement, direction, and speed so as to be constant may be employed. Examples thereof include a mode in which a multi-axis robot or the like is used.

(Edge Processing Step)

The end surfaces of the curved substrate 3 may have undergone processing such as, for example, chamfering. In the case where the curved substrate 3 is a glass, it is generally preferred to conduct the processing called R chamfering or C chamfering by mechanical grinding, but etching or other processing may be performed as the chamfering. Methods for the chamfering are not particularly limited.

(Chemical Strengthening Step)

By subjecting the curved substrate 3 to chemical strengthening, a compressive stress layer is formed in the surfaces thereof to enhance the strength and scratch resistance thereof. The chemical strengthening is a treatment in which alkali metal ions having a small ionic radium (typically, Li ions or Na ions) present in the glass surfaces are replaced with alkali metal ions having a larger ionic radium (typically, K ions) by ion exchange at a temperature equal to or lower than the glass transition temperature to thereby form a compressive stress layer in the glass surfaces. The chemical strengthening can be conducted by a conventionally known method.

(Functional Layer Forming Step)

A step for forming any of various functional layers may be conducted according to need during the production of the curved substrate with an antiglare film 1. Examples of the functional layer include an antireflection film, an antifouling film, an infrared cut film, an ultraviolet cut film, a water repellent film, and an antistatic film.

[Antireflection Film]

The term "antireflection film" means a film which has the effect of reducing reflectance to diminish glaringness due to light reflection in the surface and which, when used in an image display device, is capable of improving the transmittance of light from the image display device and thereby improving the visibility of the image display device.

In the case of forming an antireflection film, it is preferred to form the antireflection film on the antiglare film 5. The configuration of the antireflection film is not particularly limited so long as the configuration is capable of inhibiting light reflection. For example, the antireflection film can have a configuration composed of stacked layers including a high-refractive-index layer having a refractive index of 1.9 or higher at wavelength of 550 nm and a low-refractive-index layer having a refractive index of 1.6 or less at wavelength of 550 nm or a configuration including a layer which is constituted of a film matrix containing or having hollow particles or voids therein and which has a refractive index of from 1.2 to 1.4 at wavelength of 550 nm.

With respect to the film configuration including a high-refractive-index layer and a low-refractive-index layer in the antireflection film, the antireflection film may have a configuration which includes one high-refractive-index layer and one low-refractive-index layer or may have a configuration which includes two or more high-refractive-index layers and two or more low-refractive-index layers. In the case of the configuration including two or more high-refractive-index layers and two or more low-refractive-index layers, it is preferable that this configuration should be one in which the high-refractive-index layers have been stacked alternately with the low-refractive-index layers. The antireflection film may be constituted of one low-refractive-index layer only.

From the standpoint of enhancing the antireflection properties, it is preferable that the antireflection film should be a stacking composed of a plurality of stacked layers. The larger the number of stacked layers, the more possible that a film configuration exhibiting lower reflecting properties in a wider wavelength range can be optically designed. For example, it is preferable that the stacking as a whole should be composed of two or more and eight or less stacked layers, and from the standpoints of reflectance-reducing effect and suitability for mass production, it is more preferable that the stacking as a whole should be composed of two or more and six or less stacked layers. This stacking preferably is a stacking composed of stacked layers including a high-refractive-index layer and a low-refractive-index layer, as described above, and it is preferable that the total number of the high-refractive-index layer and the low-refractive-index layer should be within the range shown above.

The materials of the high-refractive-index layers and low-refractive-index layers are not particularly limited, and can be suitably selected while taking account of the degree of required antireflection properties, production efficiency, etc. For constituting the high-refractive-index layers, one or more materials selected from niobium oxide ($Nb_2O_5$), titanium oxide ($TiO_2$), zirconium oxide ($ZrO_2$), tantalum oxide ($Ta_2O_5$), and silicon nitride (SiN) can be advantageously used. For constituting the low-refractive-index layers, one or more materials selected from silicon oxide ($SiO_2$), a material including a mixed oxide of Si and Sn, a material including a mixed oxide of Si and Zr, and a material including a mixed oxide of Si and Al can be advantageously used.

Preferred from the standpoints of production efficiency and refractive index is a configuration in which the high-refractive-index layers are constituted of one material selected from niobium oxide, tantalum oxide, and silicon nitride and the low-refractive-index layers are constituted of silicon oxide.

Examples of the method for forming an antireflection film include a method in which a coating fluid is applied to the surface of an adhesion layer formed on the antiglare film 5 or on another functional film, by spin coating, dip coating, casting, slit coating, spray coating, electrostatic spray deposition method (ESD method), or the like and then heat-treated according to need, and a method in which an antireflection film is formed on the surface of the adhesion layer by chemical vapor deposition method (CVD method) or a physical vapor deposition method (PVD method) such as sputtering or PLD method.

Figure 11:
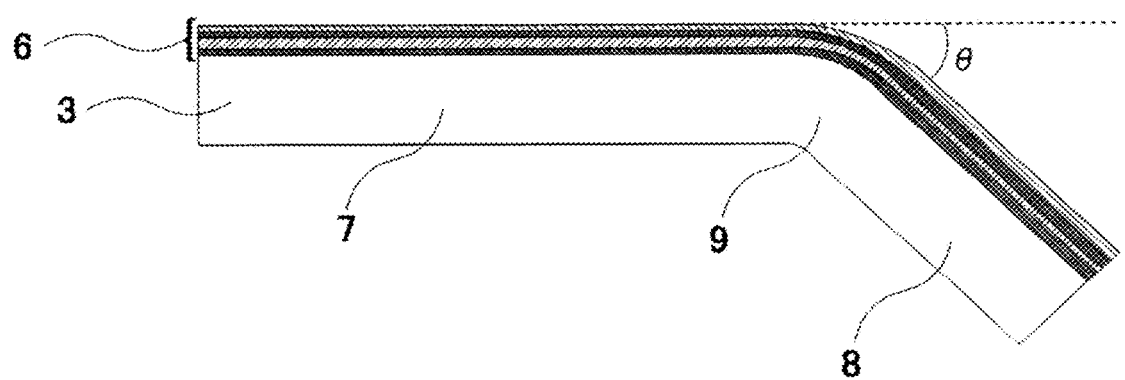
FIG. 11 is a cross-sectional view illustrating an example of a curved substrate with a film according to an embodiment of the present invention.

As shown in FIG. 11, the curved substrate according to this embodiment includes: a curved substrate 3 having a flat portion 7 and an inclined portion 8 (another flat portion differing in angle) disposed so as to have an angle θ with the flat portion 7; an antiglare film (not shown) disposed thereon; and an antireflection film 6 disposed on the antiglare film. Alternatively, the curved substrate with a film may include: a curved substrate 3 having a flat portion 7 and an inclined portion 8; and an antireflection film 6 directly disposed thereon. In either case, the antireflection film 6 on the flat portion 7 has a larger film thickness than the antireflection film 6 formed on the inclined portion 8. Furthermore, when the flat portion 7, inclined portion 8, and bent portion 9 are viewed from a vertical direction to the flat portion 7 and examined for a* and b* while eliminating reflection in the main surface of the substrate which is on the opposite side to the antireflection film, and differences between two points differing from each other most widely are expressed by Δa* and Δb*, respectively, then Δa*<5.6 and Δb*<5.4 are satisfied. In addition, the color difference ΔE defined in JIS Z 8729 (2004) by the equation $\Delta E=[(\Delta L)^2+(\Delta a^*)^2+(\Delta b^*)^2]^{0.5}$ satisfies ΔE<18. a* and b* are luminous reflectances in accordance with JIS Z 8729 (2004). Especially in the case where the angle θ between the flat portion and the inclined portion is 50° or smaller, ΔE is more preferably 5 or less.

By configuring the curved substrate with a film so as to simultaneously satisfy the requirements concerning Δa*, Δb*, and ΔE, satisfactory visibility can be ensured with respect to all of the flat portion 7, inclined portion 8, and bent portion 9. It is preferable that the a* and b* should satisfy −6.5≤a*≤6.5 and −8≤b*≤8. It is also preferable that the flat portion 7 and the inclined portion 8 should have an in-plane unevenness in a* (absolute value of difference) of 0.2 or less and an in-plane unevenness in b* of 0.5 or less, in the surface where the antireflection film 6 has been deposited. The in-plane unevenness is determined through a measurement on arbitrarily selected five points including at least one point for each of the flat portion 7, inclined portion 8, and bent portion 9.

The relationship mentioned above between the film thickness on the flat portion 7 and the film thickness on the inclined portion 8 means that the total film thickness of all layers on each of the portions satisfies that relationship. In cases where the two portions are compared with respect to each layer, there may be a layer which has a smaller thickness on the inclined portion 8 than on the flat portion 7. The thickness of each layer can be suitably regulated in accordance with the angle between the flat portion 7 and the inclined portion 8.

The curved substrate according to this embodiment described above can be produced, for example, by using a sputtering device in which the angles and positions of a plurality of targets can be independently regulated in accordance with the shape of the curved substrate. It is preferable that this sputtering device should be one in which the deposition conditions for the individual targets can be independently controlled so that the thickness of each film on the flat portion 7 and that on the inclined portion 8 can be independently controlled (deposition power, etc.).

The thickness T of the film on the bent portion 9, which is the region that connects the flat portion 7 to the inclined portion 8, is such that the thickness of each of the layers of the antireflection film 6 is intermediate between the thickness of the layer on the flat portion 7 and the thickness of the layer on the inclined portion 8. Each layer satisfied this configuration regardless of whether the thickness thereof is larger on the flat portion 7 or is larger on the inclined portion 8. Thus, since the thickness of each layer continuously changes from the flat portion 7 to the inclined portion 8, the curved substrate, although having the inclined portion 8, can be made to have a natural color tone as a whole. From the standpoint of obtaining such film thickness configuration, it is preferable that each layer should be deposited on the flat portion 7 and the inclined portion 8 simultaneously rather than separately. In case where each layer is deposited separately on the flat portion 7 and the inclined portion 8, there is the fear of resulting in a decrease in throughput, an increase in film thickness on the bent portion 9, etc.

The configurations of the antireflection film 6 described above are not limited to the antireflection film, and such configurations can be expected to produce the same effect when applied to the infrared cut film, ultraviolet cut film, water repellent film, and antistatic film.

[Antifouling Film]

The antifouling film is a film which inhibits organic matter or inorganic matter from adhering to the surface thereof or a film which has an effect wherein even when organic matter or inorganic matter has adhered to the surface thereof, the adherent substance can be easily removed by cleaning such as wiping.

In the case of forming an antifouling film, it is preferable that the antifouling film should be formed on the antiglare film 5 or on another functional film. The antifouling film is not particularly limited so long as the antifouling film is capable of imparting nonfouling properties to the curved substrate with an antiglare film 1 to be obtained. It is especially preferable that the antifouling film should be constituted of a fluorine-containing organosilicon compound coating film obtained by curing a fluorine-containing organosilicon compound by a hydrolytic condensation reaction.

The thickness of the antifouling film is not particularly limited. However, in the case where the antifouling film constituted of a fluorine-containing organosilicon compound coating film, the thickness thereof is preferably from 2 to 20 nm, more preferably from 2 to 15 nm, even more preferably from 2 to 10 nm. In cases where the film thickness thereof is 2 nm or larger, the curved substrate with a film is in the state of being evenly coated with the antifouling layer and withstands practical use from the standpoint of abrasion resistance. Meanwhile, in cases where the film thickness thereof is 20 nm or less, the curved substrate with an antiglare film 1 in the state of having the antifouling film has satisfactory optical properties including haze.

Examples of the method for forming a fluorine-containing organosilicon compound coating film include a method in which a composition of a silane coupling agent having a fluoroalkyl group, e.g., a perfluoroalkyl group or a fluoroalkyl group including a perfluoro(polyoxyalkylene) chain, is applied to the surface of an adhesion layer formed on the antiglare film 5 or on another functional film, by spin coating, dip coating, casting, slit coating, spray coating, or the like and then heat-treated according to need; and a vacuum deposition method in which a fluorine-containing organosilicon compound is deposited from a vapor phase on the surface of the adhesion layer and then heat-treated according to need. There are no limitations on techniques for coating film formation.

The composition for coating film formation is not particularly limited so long as the composition contains a fluorine-containing hydrolyzable silicon compound and is capable of forming a coating film. The composition for coating film formation may contain an optional ingredient besides the fluorine-containing hydrolyzable silicon compound, or may be constituted only of one or more fluorine-containing hydrolyzable silicon compounds. Examples of the optional ingredient include a hydrolyzable silicon compound having no fluorine atom (hereinafter referred to as "non-fluorinated hydrolyzable silicon compound"), which may be used so long as the effects of the invention are not lessened thereby, and a catalyst.

When incorporating a fluorine-containing hydrolyzable silicon compound and a non-fluorinated hydrolyzable silicon compound, which is optional, into a composition for coating film formation, these compounds may be incorporated as such or may be incorporated as a product of partial hydrolysis and condensation thereof. Furthermore, these compounds may be incorporated as a mixture of these compounds with a product of partial hydrolysis and condensation thereof, into a composition for coating film formation.

In the case of using two or more hydrolyzable silicon compounds in combination, these compounds may be incorporated as such into a composition for coating film formation or may each be incorporated as a product of partial hydrolysis and condensation. Furthermore, two or more of these compounds may be incorporated as a product of partial hydrolysis and co-condensation thereof. Moreover, the composition may be a mixture of these compounds, the products of partial hydrolysis and condensation, and the product of partial hydrolysis and co-condensation. However, in the case of deposition by vacuum deposition or the like, the products of partial hydrolysis and condensation and product of partial hydrolysis and co-condensation to be used are ones each having a degree of polymerization that renders vacuum deposition possible. Hereinafter, the term "hydrolyzable silicon compounds" is used so as to not only mean the compounds themselves but also imply any of such products of partial hydrolysis and condensation and products of partial hydrolysis and co-condensation.

The fluorine-containing hydrolyzable silicon compound to be used for forming the fluorine-containing organosilicon compound coating film according to the invention is not particularly limited so long as the fluorine-containing organosilicon compound coating film obtained therefrom has antifouling properties including water repellency and oil repellency.

Specifically, examples thereof include fluorine-containing hydrolyzable silicon compounds each having one or more groups selected from the group consisting of a perfluoropolyether group, a perfluoroalkylene group, and a perfluoroalkyl group. These groups are each present as a fluorine-containing organic group bonded to the silicon atom of a hydrolyzable silyl group either via a connecting group or directly. Advantageously usable commercial products of such fluorine-containing organosilicon compounds each having one or more groups selected from the group consisting of a perfluoropolyether group, a perfluoroalkylene group, and a perfluoroalkyl group (fluorine-containing hydrolyzable silicon compounds) include KP-801 (trade name; manufactured by Shin-Etsu Chemical Co., Ltd), X-71 (trade name; manufactured by Shin-Etsu Chemical Co., Ltd), KY-130 (trade name; manufactured by Shin-Etsu Chemical Co., Ltd), KY-178 (trade name; manufactured by Shin-Etsu Chemical Co., Ltd), KY-185 (trade name; manufactured by Shin-Etsu Chemical Co., Ltd), KY-195 (trade name; manufactured by Shin-Etsu Chemical Co., Ltd), AFLUID (registered trademark) S-550 (trade name; manufactured by Asahi Glass Co., Ltd.), and OPTOOL (registered trademark) DSX (trade name; manufactured by Daikin Industries, Ltd.). It is more preferred to use KY-185, KY-195, OPTOOL DSX, or S-550 among these.

A composition for coating film formation which contains such a fluorine-containing hydrolyzable silicon compound is adhered to the surface of the adhesion layer and reacted to deposit a film. Thus, a fluorine-containing organosilicon compound coating film is obtained. A heat treatment or a humidifying treatment may be performed after the deposition according to need in order to accelerate the reaction. With respect to specific deposition methods and reaction conditions, it is possible to apply conventionally known methods, conditions, etc.

The outermost surface of the curved substrate with a film 1 in which an antifouling layer has been formed has a coefficient of static friction of preferably 1.0 or less, more preferably 0.9 or less, even more preferably 0.8 or less. In cases where the coefficient of static friction thereof is 1.0 or less, satisfactory finger sliding properties are obtained when a human finger touches the outermost surface of the curved substrate with an antiglare film 1. Meanwhile, the bent portion of the first surface has a coefficient of dynamic friction of preferably 0.02 or less, more preferably 0.015 or less, even more preferably 0.01 or less. In cases where the coefficient of dynamic friction thereof is 0.02 or less, satisfactory finger sliding properties are obtained when a human finger touches the bent portion of the first surface.

[Other Functional Layer]

The curved substrate with an antiglare film 1 may be one which at least a part thereof has the other functional layer.

Examples of the functional layer include an undercoat layer, an adhesion-improving layer, and a protective layer.

The undercoat layer functions as an alkali barrier layer or as a wide-band low-refractive-index layer or high-refractive-index layer.

In addition, the second main surface 3b of the curved substrate 3 may have undergone a treatment for forming a functional film or imparting a function, such as an antifogging treatment, or undergone printing, etc.

The steps described above, including the firing step, may be performed in any order without particular limitations, except that the antiglare-film forming step, which will be described later, is conducted after the molding step. Of the steps described above, the steps other than the molding step may be omitted. Other steps may be added.

In the case where a glass is employed as the material of the curved substrate 3, an antiglare film 5 may be formed on the shaped curved substrate 3 which has not been strengthened or on the shaped curved substrate 3 which has undergone a strengthening treatment.

In the former case, the shaped curved substrate 3 which has not been strengthened may be subjected to a strengthening treatment after the formation of an antiglare film 5 thereon. Furthermore, the main surfaces of the curved substrate 3 on which an antiglare film 5 has not been formed may be subjected to polishing and edge processing. There are cases where the glass which has undergone chemical strengthening by ion exchange has defects in the surfaces thereof or have fine irregularities of about 1 μm at the most that remain in the surfaces. In cases where force is applied to the curved substrate 3, stress concentration occurs where such defects or fine irregularities are present, resulting in cases where the curved substrate 3 is broken by a force lower than a theoretical strength. Consequently, a layer (defect layer) having such defects and fine irregularities which is present in the curved substrate 3 that has been chemically strengthened may be removed by polishing. As a method for the polishing, the method described above can be used. In the case where defects are present, the thickness of the defect layer is usually from 0.01 to 0.5 μm although varying depending on the conditions for the chemical strengthening. In the case of performing a chemical strengthening step after an antiglare-film forming step, the chemical strengthening step can be utilized not only for chemically strengthening the glass but also for heating the formed antiglare film by the heat for the chemical strengthening. Thus, the polycondensation or sintering of the antiglare film can be accelerated to obtain a film which has high strength regarding wear resistance, weatherability, etc. In the case where the antiglare film is heated in the chemical strengthening step, immersion of the curved substrate 3, on which the antiglare film has been formed, in a strengthening salt is more effective in enhancing the strength than heating in the air. Although details of the mechanism of this strength enhancement are unclear, the strength enhancement is thought to be because ions of, for example, potassium penetrate into the film in the chemical strengthening to introduce stress into the film itself and because the polycondensation of the antiglare film is accelerated since the strengthening salt is weakly alkaline.

The latter case is free from the problems which arise when a curved substrate 3 is processed by steps in the former order, such as the occurrence of defects in the antiglare film and the warpage of the curved substrate 3 due to the presence of the antiglare film 5 in the strengthening step. A high production efficiency is hence obtained in the latter case. Furthermore, as in the former case, the curved substrate 3 may be subjected to polishing and edge processing before treatment of the antiglare film 5.

<Curved Substrate with Antiglare Film>
[Antiglare Film]

The antiglare film is a film which has the effect of mainly scattering reflected light to diminish reflected-light glaringness due to light-source reflection in the surface.

The antiglare film 5 is a film obtained by firing a coating film of a composition which includes at least one of a silica precursor (A) and particles (C) and further includes a liquid medium (B) and which may contain ingredients other than the silica precursor (A) and the particles (C) according to need. In the case where the composition includes a silica precursor (A), the matrix of the antiglare film 5 includes a matrix derived from the silica precursor (A) and including silica as the main component. The antiglare film 5 may be configured of the particles (C). The antiglare film 5 may be a film including the matrix and the particles (C) dispersed therein.

The composition contains a liquid medium (B1) having a boiling point of 150° C. or lower, as some or all of the liquid medium (B). The content of the liquid medium (B1) is 86 mass % or higher based on the whole liquid medium (B).

The surface of the antiglare film 5 has a 60° mirror surface glossiness of preferably 15% or higher and 140% or less, more preferably 40% or higher and 130% or less. The 60° mirror surface glossiness of the surface of the antiglare film 5 is an index to antiglare effect. In cases where the 60° mirror surface glossiness thereof is 130% or less, a sufficient antiglare effect is exhibited.

The surface of the antiglare film 5 has an arithmetic average roughness Ra of preferably 0.03 µm or higher, more preferably from 0.05 to 0.7 µm, even more preferably from 0.07 to 0.5 µm. In cases where the arithmetic average roughness Ra of the surface of the antiglare film 5 is 0.03 µm or higher, a sufficient antiglare effect is exhibited. In cases where the arithmetic average roughness Ra of the surface of the antiglare film 5 is 0.7 µm or less, which is the upper limit of the range shown above, the image contrast can be sufficiently inhibited from decreasing.

The surface of the antiglare film 5 has a maximum height roughness Rz of preferably from 0.2 to 5 µm, more preferably from 0.3 to 4.5 µm, even more preferably from 0.5 to 4.0 µm. In cases where the maximum height roughness Rz of the surface of the antiglare film 5 is equal to or higher than the lower limit of the range, a sufficient antiglare effect is exhibited. In cases where the maximum height roughness Rz of the surface of the antiglare film 5 is equal to or less than the upper limit of the range, the image contrast can be sufficiently inhibited from decreasing.

The flat portion 7 of the curved substrate with an antiglare film 1 has a haze of preferably from 0.1 to 50%, more preferably from 0.1 to 30%, even more preferably from 0.1 to 20%. In cases where the haze thereof is 0.1% or higher, an antiglare effect is exhibited. In cases where the haze thereof is 50% or less, the image contrast can be sufficiently inhibited from decreasing, in the case where the curved substrate with an antiglare film 1 is disposed as a protective plate or any of various filters on the viewing side of an image display device main body.

The bent portion 9 of the curved substrate with an antiglare film has a haze of preferably from 0.1 to 50%, more preferably from 0.1 to 30%, even more preferably from 0.1 to 20%. In cases where the haze thereof is 0.1% or higher, an antiglare effect is exhibited. In cases where the haze thereof is 50% or less, the image contrast can be sufficiently inhibited from decreasing, in the case where the curved substrate with an antiglare film is disposed as a protective plate or any of various filters on the viewing side of an image display device main body.

In the case where the curved substrate with an antiglare film 1 is a curved substrate 3 having a flat portion 7 and a bent portion 9, such as that shown in FIG. 1A, the ratio of reflected-image diffusibility index value R [(reflected-image diffusibility index value R of the bent portion 9)/(sum of reflected-image diffusibility index value R of the a flat portion 7 and reflected-image diffusibility index value R of the bent portion 9)] is preferably from 0.3 to 0.8, more preferably from 0.4 to 0.7, especially preferably from 0.4 to 0.6. In cases where the ratio is within that range, this curved substrate with an antiglare film 1, when viewed from the user side, looks like having undergone a homogeneous antiglare film treatment and has a highly beautiful appearance. Furthermore, the touch feel due to the roughness of the antiglare film is not impaired. Especially in the case where the curved substrate with an antiglare film 1 has a high haze, the ratio of reflected-image diffusibility index value R is more preferably from 0.4 to 0.7, even more preferably from 0.4 to 0.6. In the case of high-haze antiglare films, whiteness is enhanced by light scattering and shading is prone to occur, resulting in an influence on visual evenness in appearance. In cases where the ratio of reflected-image diffusibility index value R is within that range, the visual evenness in appearance is less apt to be affected by shading and an excellent appearance is obtained.

The curved substrate with an antiglare film 1 has an in-plane standard deviation of haze of from 0 to 10%, more preferably from 0 to 6%. In cases where the in-plane standard deviation thereof is within that range, this curved substrate with an antiglare film 1, when viewed from the user side, looks like having undergone a homogeneous antiglare film treatment and has a highly beautiful appearance. Furthermore, the touch feel due to the roughness of the antiglare film is not impaired.

In the case where the curved substrate with an antiglare film 1 is constituted only of a bent portion 9 having a curvature of not 0, such as that shown in FIG. 1B, the antiglare film disposed in the bent portion 9 has an in-plane standard deviation of haze of 0% or higher and 10% or less.

The curved substrate with an antiglare film 1 has an in-plane standard deviation of sparkle index value S of from 0 to 10%, more preferably from 0 to 6%. In cases where the in-plane standard deviation thereof is within that range, the screen of, for example, a liquid-crystal display can be viewed without arousing an unusual feeling.

The curved substrate with an antiglare film 1 has an in-plane standard deviation of Resolution index value T of from 0 to 10%, more preferably from 0 to 6%. In cases where the in-plane standard deviation thereof is within that range, the screen of, for example, a liquid-crystal display can be viewed without arousing an unusual feeling.

The curved substrate with an antiglare film 1 has an in-plane standard deviation of 60° mirror surface glossiness of from 0 to 20%, more preferably from 0 to 15%. In cases where the in-plane standard deviation thereof is within that range, the screen of, for example, a liquid-crystal display can be viewed without arousing an unusual feeling.

<Method for Producing Curved Substrate with Antiglare Film>

The method for producing the curved substrate with an antiglare film of the present invention includes:

a step of preparing a composition including at least one of a silica precursor (A) and particles (C) and further including a liquid medium (B) (hereinafter also referred to as "composition preparing step");

a step of forming a coating film on the curved substrate by using an electrostatic coating apparatus to charge and spray the composition, thereby coating the curved substrate (hereinafter, referred to also as "coating step"); and a step of firing the coating film (hereinafter also referred to as "firing step"). According to need, the process may include a step in which before the formation of an antiglare film, a functional layer is formed on a surface of a substrate main body to produce a substrate, and may include a step in which after the formation of an antiglare film, known after processing is given to the curved substrate with a film.

(Composition Preparing Step)

The composition includes at least one of a silica precursor (A) and particles (C) and further includes a liquid medium (B).

In the case where the composition contains no silica precursor (A) and contains particles (C), it is preferable that the particles (C) should have an average particle diameter of 30 nm or smaller.

The composition may contain a binder (D) other than the silica precursor (A), other additives (E), etc according to need.

(A) Silica Precursor

Examples of the silica precursor (A) include a silane compound (A1) having a hydrocarbon group bonded to a silicon atom and a hydrolyzable group bonded to a silicon atom, a hydrolysis and condensation product thereof, an alkoxysilane (excluding the silane compound (A1)), a hydrolysis and condensation product thereof (sol-gel silica), and a silazane.

In the silane compound (A1), the hydrocarbon group bonded to a silicon atom may be either a monovalent hydrocarbon group bonded to one silicon atom or a divalent hydrocarbon group bonded to two silicon atoms. Examples of the monovalent hydrocarbon group include an alkyl group, an alkenyl group, and an aryl group. Examples of the divalent hydrocarbon group include an alkylene group, an alkenylene group, and an arylene group.

The hydrocarbon group may have one or two or more groups in combination selected from —O—, —S—, —CO—, and —NR'— (wherein R' is a hydrogen atom or a monovalent hydrocarbon group) between carbon atoms.

Examples of the hydrolyzable group bonded to a silicon atom include an alkoxy group, an acyloxy group, a ketoxime group, an alkenyloxy group, an amino group, an aminoxy group, an amide group, an isocyanate group, and a halogen atom. Preferred of these is an alkoxy group, an isocyanate group, and a halogen atom (in particular, a chlorine atom), from the standpoint of a balance between the stability and hydrolyzability of the silane compound (A1).

Preferred as the alkoxy group is an alkoxy group having a carbon number of from 1 to 3. Methoxy group or ethoxy group is more preferred.

In the case where there are a plurality of hydrolyzable groups in the silane compound (A1), the hydrolyzable groups may be the same or different groups. From the standpoint of availability, it is preferable that these hydrolyzable groups should be the same group.

Examples of the silane compound (A1) include compounds represented by formula (I), which will be described later, an alkoxysilane having an alkyl group (methyltrimethoxysilane, ethyltriethoxysilane, etc.), an alkoxysilane having a vinyl group (vinyltrimethoxysilane, vinyltriethoxysilane, etc.), an alkoxysilane having an epoxy group (2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, etc.), and an alkoxysilane having an acryloyloxy group (3-acryloxyoxypropyltrimethoxysilane, etc.).

The silane compound (A1) preferably is a compound represented by the following formula (I), from the standpoint that this compound gives an antiglare film which, even when thick, is less apt to crack or peel off.

$$R_{3-p}L_pSi\text{-}Q\text{-}SiL_pR_{3-p} \tag{I}$$

In the formula (I), Q is a divalent hydrocarbon group (which may have one or two or more groups in combination selected from —O—, —S—, —CO—, and —NR'— (wherein R' is a hydrogen atom or a monovalent hydrocarbon group) between carbon atoms). Examples of the divalent hydrocarbon group include those mentioned above.

From the standpoints of availability and of giving an antiglare film which, even when thick, is less apt to crack or peel off, Q is preferably an alkylene group having a carbon number of from 2 to 8, more preferably an alkylene group having a carbon number of from 2 to 6.

In the formula (I), L is a hydrolyzable group. Examples of the hydrolyzable group include those mentioned above. Preferred examples thereof are also the same.

R is a hydrogen atom or a monovalent hydrocarbon group. Examples of the monovalent hydrocarbon group include those mentioned above.

Symbol p is an integer of from 1 to 3. From the standpoint of avoiding too low a reaction rate, p is preferably 2 or 3, especially preferably 3.

Examples of the alkoxysilane (excluding the silane compound (A1)) include a tetraalkoxysilane (tetramethoxysilane, tetraethoxysilane, tetrapropoxysilane, tetrabutoxysilane, etc.), an alkoxysilane having a perfluoropolyether group ((perfluoropolyether)triethoxysilanes, etc.), and an alkoxysilane having a perfluoroalkyl group (perfluoroethyltriethoxysilane, etc.).

Hydrolysis and condensation of the silane compound (A1) and the alkoxysilane (excluding the silane compound (A1)) can be conducted by a known method.

For example, in the case of a tetraalkoxysilane, the hydrolysis and condensation may be conducted using water in an amount of at least 4 times by mole the amount of the tetraalkoxysilane and using an acid or alkali as a catalyst.

Examples of the acid include an inorganic acid ($HNO_3$, $H_2SO_4$, HCl, etc.) and an organic acid (formic acid, oxalic acid, monochloroacetic acid, dichloroacetic acid, trichloroacetic acid, etc.). Examples of the alkali include ammonia, sodium hydroxide, and potassium hydroxide. The catalyst preferably is an acid, from the standpoint of the long-term storability of the hydrolysis and condensation product of the silane compound (A1).

One kind of the silica precursor (A) may be used alone, or two or more kinds thereof may be used in combination.

From the standpoint of preventing the antiglare film from cracking or peeling off, it is preferable that the silica precursor (A) should include one or both of the silane compound (A1) and a hydrolysis and condensation product thereof.

From the standpoint of the wear resistance of the antiglare film, it is preferable that the silica precursor (A) should include one or both of a tetraalkoxysilane and a hydrolysis and condensation product thereof.

It is especially preferable that the silica precursor (A) should include one or both of the silane compound (A1) and a hydrolysis and condensation product thereof and further include one or both of a tetraalkoxysilane and a hydrolysis and condensation product thereof.

(B) Liquid Medium

In the case where the composition contains the silica precursor (A), the liquid medium (B) serves as a medium in which the silica precursor (A) has been dissolved or dispersed. In the case where the composition contains particles (C), the liquid medium (B) serves as a medium in which the particles (C) have been dispersed. In the case where the composition contains both the silica precursor (A) and particles (C), the liquid medium (B) may be one which functions both as a solvent or dispersion medium for dissolving or dispersing the silica precursor (A) therein and as a dispersion medium for dispersing the particles (C) therein.

The liquid medium (B) at least includes a liquid medium (B1) having a boiling point of 150° C. or lower. The boiling point of the liquid medium (B1) is preferably from 50 to 145° C., more preferably from 55 to 140° C.

In cases where the boiling point of the liquid medium (B1) is 150° C. or lower, this composition, when coating a substrate using an electrostatic coating apparatus equipped with an electrostatic spray gun having a rotary atomizing head and then fired, gives a film which has more preferable antiglare performance. In cases where the boiling point of the liquid medium (B1) is equal to or higher than the lower limit of the range, it is possible, after adhesion of droplets of the composition to a surface of the substrate, to form a rugged structure while sufficiently maintaining the shape of the droplets.

Examples of the liquid medium (B1) include water, an alcohol (methanol, ethanol, isopropyl alcohol, n-butyl alcohol, isobutyl alcohol, 1-pentanol, etc.), a ketone (acetone, methyl ethyl ketone, methyl isobutyl ketone, etc.), an ether (tetrahydrofuran, 1,4-dioxane, etc.), a cellosolve compound (methyl cellosolve, ethyl cellosolve, etc.), an ester (methyl acetate, ethyl acetate, etc.), and a glycol ether (ethylene glycol monomethyl ether, ethylene glycol monoethyl ether, etc.).

One kind of the liquid medium (B1) may be used alone, or two or more kinds thereof may be used in combination.

The liquid medium (B) may, according to need, further contain a liquid medium other than the liquid medium (B1), that is, may further contain a liquid medium having a boiling point exceeding 150° C. The proportion of this liquid medium having a boiling point exceeding 150° C. is less than 14 mass % based on the whole liquid medium (B).

Examples of the other liquid medium include an alcohol, a ketone, an ether, a cellosolve compound, an ester, a glycol ether, a nitrogen-containing compound, and a sulfur-containing compound.

Examples of the alcohol include diacetonealcohol, 1-hexanol, and ethylene glycol.

Examples of the nitrogen-containing compound include N,N-dimethylacetamide, N,N-dimethylformamide, and N-methylpyrrolidone.

Examples of the glycol ether include ethylene glycol monobutyl ether.

Examples of the sulfur-containing compound include dimethyl sulfoxide.

One kind of the other liquid media may be used alone, or two or more kinds thereof may be used in combination.

Water is necessary for the hydrolysis of the alkoxysilane among examples of the silica precursor (A). Consequently, the liquid medium (B) at least includes water as some or all of the liquid medium (B1), unless displacement of the liquid medium is conducted after the hydrolysis.

In this case, the liquid medium (B) may be constituted only of water or may be a liquid mixture of water and other liquid. The other liquid may be a liquid medium (B1) which is not water or may be another liquid medium. Examples thereof include an alcohol, a ketone, an ether, a cellosolve compound, an ester, a glycol ether, a nitrogen-containing compound, and a sulfur-containing compound. Preferred of these as a solvent for the silica precursor (A) is the alcohol. Especially preferred are methanol, ethanol, isopropyl alcohol, and butanol.

(C) Particles

The particles (C) constitute an antiglare film either by themselves or together with a matrix derived from the silica precursor (A).

In the case where the composition contains no silica precursor (A) and contains particles (C), it is preferable that the particles (C) should have an average particle diameter of 30 nm or smaller.

Examples of the particles (C) include flaky particles (C1) and other particles (C2) which are not flaky particles (C1).

Flaky Particles (C1):

The flaky particles (C1) have an average aspect ratio of preferably from 50 to 650, more preferably from 100 to 350, even more preferably from 170 to 240. In cases where the average aspect ratio of the flaky particles (C1) is 50 or higher, the antiglare film, even when thick, is sufficiently inhibited from cracking or peeling off In cases where the aspect ratio of the flaky particles (C1) is 650 or less, the flaky particles (C1) show satisfactory dispersion stability in the composition.

The flaky particles (C1) have an average particle diameter of preferably from 0.08 to 0.42 μm, more preferably from 0.17 to 0.21 μm. In cases where the average particle diameter of the flaky particles (C1) is 0.08 μm or larger, the antiglare film, even when thick, is sufficiently inhibited from cracking or peeling off. In cases where the average particle diameter of the flaky particles (C1) is 0.42 μm or smaller, the flaky particles (C1) show satisfactory dispersion stability in the composition.

Examples of the flaky particles (C1) include flaky silica particles, flaky alumina particles, flaky titania, and flaky zirconia.

The flaky silica particles may be either primary silica particles of a thin platy shape or secondary silica particles each made up of a plurality of thin-plate-shaped primary silica particles which have been aligned and stacked so that the planes are parallel with each other. The secondary silica particles each usually have a stacking.

The flaky silica particles may be composed solely of the primary silica particles or of the secondary silica particles, or may be composed of both.

The thickness of the primary silica particles is preferably from 0.001 to 0.1 μm. In cases where the thickness of the primary silica particles is within that range, flaky secondary silica particles can be formed in each of which one or multiple sheets have been stacked and aligned in parallel with each other.

The ratio of the minimum length to the thickness of the primary silica particles (minimum length/thickness) is preferably 2 or larger, more preferably 5 or larger, even more preferably 10 or larger.

The thickness of the secondary silica particles is preferably from 0.001 to 3 μm, more preferably from 0.005 to 2 μm.

The ratio of the minimum length to the thickness of the secondary silica particles is preferably 2 or larger, more preferably 5 or larger, even more preferably 10 or larger.

It is preferable that the secondary silica particles should be present independently of one another without having been fused to one another.

The flaky silica particles have an $SiO_2$ purity of preferably 90 mass % or higher, more preferably 95 mass % or higher.

For preparing the composition, use is made of either a powder which is a mass of a plurality of flaky silica particles or a dispersion obtained by dispersing the powder in a liquid medium. The silica concentration in the dispersion is preferably from 1 to 80 mass %.

There are cases where besides the flaky silica particles, silica particles of an indefinite shape which have been yielded during production of the flaky silica particles are contained in the powder or the dispersion. Flaky silica particles are obtained, for example, by disaggregating and dispersing tertiary silica particles in the form of aggregates (hereinafter also referred to as silica aggregates) which each are made up of flaky silica particles that have been aggregated and irregularly stacked and which have interstices therein. The silica particles of an indefinite shape are silica aggregates in the state of having been reduced into finer particles to some degree and of having been not reduced into individual flaky silica particles. Namely, these silica particles are in the form of aggregates each composed of a plurality of flaky silica particles. Inclusion of such silica particles of an indefinite shape has the possibility of formation of an antiglare film which has reduced denseness and is prone to crack or peel off. Because of this, the lower content of indefinite-shape silica particles in the powder or dispersion is preferred.

Silica particles of an indefinite shape and silica aggregates are both observed as black particles in an examination with a TEM. Meanwhile, the primary silica particles or secondary silica particles which are each in a thin platy shape are observed as transparent or translucent particles in an examination with a TEM.

A commercial product of flaky silica particles may be used, or the flaky silica particles to be used may be produced.

It is preferable that the flaky silica particles should be ones produced by the method described in JP-A-2014-094845. According to the production method disclosed therein, the formation of indefinite-shape silica particles during the production steps is suppressed as compared with known production methods (e.g., the method described in Japanese Patent No. 4063464) and a powder or dispersion having a low content of indefinite-shape silica particles can be obtained.

Particles (C2):

Examples of the particles (C2) other than the flaky particles (C1) include metal oxide particles, metal particles, pigment-based particles, and resin particles.

Examples of the material of the metal oxide particles include $Al_2O_3$, $SiO_2$, $SnO_2$, $TiO_2$, $ZrO_2$, $ZnO$, $CeO_2$, Sb-containing $SnO_x$ (ATO), Sn-containing $In_2O_3$ (ITO), and $RuO_2$. Since the matrix in the antiglare film according to the invention is silica, it is preferable that the material of the metal oxide particles should be $SiO_2$, which has the same refractive index as the matrix.

Examples of the material of the metal particles include metals (Ag, Ru, etc.) and alloys (AgPd, RuAu, etc.).

Examples of the pigment-based particles include inorganic pigments (titanium black, carbon black, etc.) and organic pigments.

Examples of the material of the resin particles include an acrylic resin, polystyrene, and a melamine resin.

Examples of the shape of the particles (C2) include spherical, ellipsoidal, acicular, platy, rod-shaped, conical, cylindrical, cubic, rectangular-parallelopiped, diamond, star, and indefinite shapes. Such other particles may be present in such a state that the particles are independent of one another or that the particles have been connected to form chains or have been aggregated.

The particles (C2) may be solid particles or hollow particles, or may be perforated particles such as porous particles.

The particles (C2) have an average particle diameter of preferably from 0.1 to 2 μm, more preferably from 0.5 to 1.5 μm. In cases where the average particle diameter of the particles (C2) is 0.1 μm or larger, a sufficient antiglare effect is exhibited. In cases where the average particle diameter of the particles (C2) is 2 μm or smaller, the particles (C2) show satisfactory dispersion stability in the composition.

In the case of adding porous spherical silica particles, the BET specific surface area thereof is preferably from 200 to 300 $m^2/g$.

The pore volume of the porous spherical silica particles is preferably 0.5-1.5 $cm^3/g$.

Examples of commercial products of such porous spherical silica particles include LIGHT STAR (registered trademark) series, manufactured by Nissan Chemical Industries, Ltd.

One kind of the particles (C) may be used alone or two or more kinds thereof may be used in combination.

It is preferable that the particles (C) should include the flaky particles (C1), and the particles (C) may further include the particles (C2). The inclusion of the flaky particles (C1) enhances the haze of the antiglare film to bring about better antiglare performance. Furthermore, inclusion of the flaky particles (C1) is more effective, than the particles (C2), in inhibiting the antiglare film from cracking or peeling off when having an increased thickness.

(D) Binder

Examples of the binder (D) (excluding the silica precursor (A)) include an inorganic substance, a resin, and the like which are dissolved or dispersed in the liquid medium (B).

Examples of the inorganic substance include a precursor for a metal oxide other than silica (metal: titanium, zirconium, etc.).

Examples of the resin include a thermoplastic resin, a thermosetting resin, and an ultraviolet-curable resin.

(E) Additives

The composition may further contain an additive (E) according to need so long as the effects of the invention are not lessened thereby.

Examples of the additive (E) include an organic compound (E1) having a polar group, an ultraviolet absorber, an infrared-reflecting agent, an infrared absorber, an antireflection agent, a surfactant for improving leveling properties, and a metal compound for improving durability.

In the case where the composition contains particles (C), the particles (C) can be inhibited from electrostatically agglomerating in the composition, by incorporating an organic compound (E1) having a polar group into the composition.

From the standpoint of the effect of inhibiting the particles (C) from agglomerating, the organic compound (E1) having a polar group is preferably one having a hydroxy group and/or a carbonyl group in the molecule, more preferably one having in the molecule one or more kinds selected from the group consisting of a hydroxy group, an aldehyde group (—CHO), a ketone group (—C(=O)—), an ester bond ((—C(=O)O—), and a carboxyl group (—COOH), and even more preferably one having in the molecule one or more kinds selected from the group consisting of a carboxyl group, a hydroxy group, an aldehyde group, and a ketone group.

Examples of the organic compound (E1) having a polar group include an unsaturated carboxylic acid polymer, a cellulose derivative, an organic acid (excluding an unsaturated carboxylic acid polymer), and a terpene compound. One kind of the organic compound (E1) may be used alone, or two or more kinds thereof may be used in combination.

Examples of the surfactant for improving leveling properties include a silicone oil surfactant and an acrylic surfactant.

Preferred as the metal compound for improving durability is a zirconium chelate compound, a titanium chelate compound, an aluminum chelate compound, or the like. Examples of the zirconium chelate compound include zirconium tetraacetyl acetonate and zirconium tributoxy stearate.

[Makeup]

The total content of the silica precursor (A) and the particles (C) in the composition is preferably from 30 to 100 mass %, more preferably from 40 to 100 mass %, based on the solid components (100 mass %) of the composition (provided that the amount of the silica precursor (A) is given in terms of $SiO_2$ amount). In cases where the total content of the silica precursor (A) and the particles (C) is equal to or higher than the lower limit of the range, the antiglare film has excellent adhesion to the curved substrate. In cases where the total content of the silica precursor (A) and the particles (C) is equal to or less than the upper limit of the range, the antiglare film is inhibited from cracking or peeling off.

In the case where the composition contains the silica precursor (A), the content of the silica precursor (A) (in terms of $SiO_2$) in the composition is preferably from 35 to 95 mass %, more preferably from 50 to 90 mass %, based on the solid components (100 mass %) of the composition (provided that the amount of the silica precursor (A) is given in terms of $SiO_2$ amount). In cases where the content of the silica precursor (A) is equal to or higher than the lower limit of the range, the antiglare film has sufficient strength of adhesion to the curved substrate. In cases where the content of the silica particles (A) is equal to or less than the upper limit of the range, the antiglare film, even when thick, is sufficiently inhibited from cracking or peeling off.

In the case where the composition contains the silica precursor (A) and the silica precursor (A) includes one or both of the silane compound (A1) and a hydrolysis and condensation product thereof, the proportion of the silane compound (A1) and the hydrolysis and condensation product thereof in the silica precursor (A) is preferably from 5 to 100 mass % based on the silica precursor (A) on a solid basis in terms of $SiO_2$ (100 mass %). In cases where the proportion of the silane compound (A1) and the hydrolysis and condensation product thereof is equal to or higher than the lower limit of the range, the antiglare film, even when thick, is sufficiently inhibited from cracking or peeling off The content of the liquid medium (B) in the composition depends on the solid concentration of the composition.

The solid concentration of the composition is preferably from 0.01 to 50 mass %, more preferably from 0.01 to 6 mass %, based on the whole composition (100 mass %). In cases where the solid concentration thereof is equal to or higher than the lower limit of the range, the liquid amount of the composition can be reduced. In cases where the solid concentration thereof is equal to or less than the upper limit of the range, the antiglare film has improved evenness in film thickness.

The solid concentration of the composition is the sum of the contents of all the components other than the liquid medium (B) in the composition. However, the content of the silica precursor (A) is given in terms of $SiO_2$ content.

The content of the liquid medium (B1) having a boiling point of 150° C. or lower in the composition is 86 mass % or higher based on the whole liquid medium (B). The inclusion of the liquid medium (B1) in a proportion of 86 mass % or higher enables the composition to form an antiglare film having more preferable performance when applied to a curved substrate using an electrostatic coating apparatus equipped with an electrostatic spray gun having a rotary atomizing head and then fired. In case where the proportion of the liquid medium (B1) is less than 86 mass %, there is a possibility that the applied composition might be smoothed before solvent volatilization and drying and, hence, unable to form a rugged structure, resulting in a fired film which is not an antiglare film.

The content of the liquid medium (B1) is preferably 90 mass % or higher based on the whole liquid medium (B). The content of the liquid medium (B1) may be 100 mass % based on the whole liquid medium (B).

In the case where the composition contains particles (C), the content of the particles (C) is preferably from 1 to 40 mass %, more preferably from 5 to 30 mass %, based on the solid components (100 mass %) of the composition (provided that the amount of the silica precursor (A) is given in terms of $SiO_2$ amount). In cases where the content of the particles (C) is equal to or higher than the lower limit of the range, the curved substrate with an antiglare film has a sufficiently high haze and the surface of the antiglare film has a sufficiently low 60° mirror surface glossiness. A sufficient antiglare effect is hence exhibited. In cases where the content of the particles (C) is equal to or less than the upper limit of the range, sufficient wear resistance is obtained.

In the case where the composition contains particles (C) and the particles (C) include flaky particles (C1), the content of the flaky particles (C1) is preferably 20 mass % or higher, more preferably 30 mass % or higher, based on the whole particles (C) (100 mass %). There is no particular upper limit, and the content thereof may be 100 mass %. In cases where the proportion of the flaky particles (Cl) is equal to or higher than the lower limit of the range, an even better antiglare effect is obtained. In addition, the antiglare film, even when thick, is sufficiently inhibited from cracking or peeling off The composition can be prepared, for example, by preparing a solution of a silica precursor (A) in a liquid medium (B) and optionally mixing this solution with an additional liquid medium (B), a dispersion of particles (C), etc.

In the case where the composition contains particles (C) and the silica precursor (A) includes a hydrolysis and condensation product of a tetraalkoxysilane, it is preferable that either a solution of the tetraalkoxysilane or a solution of a mixture of the tetraalkoxysilane and a hydrolysis and condensation product thereof should be mixed with a dispersion of the particles (C) and the tetraalkoxysilane be then hydrolyzed and condensed in the presence of the particles (C), from the standpoint that antiglare films having desired performance can be produced from the resultant composition with a high level of reproducibility.

(Antiglare-Film Forming Step)

The composition is applied to the substrate by charging and spraying the composition using an electrostatic coating apparatus, in particular, using an electrostatic coating apparatus equipped with an electrostatic spray gun having a rotary atomizing head. Thus, a coating film of the composition is formed on the substrate.

Figure 3:
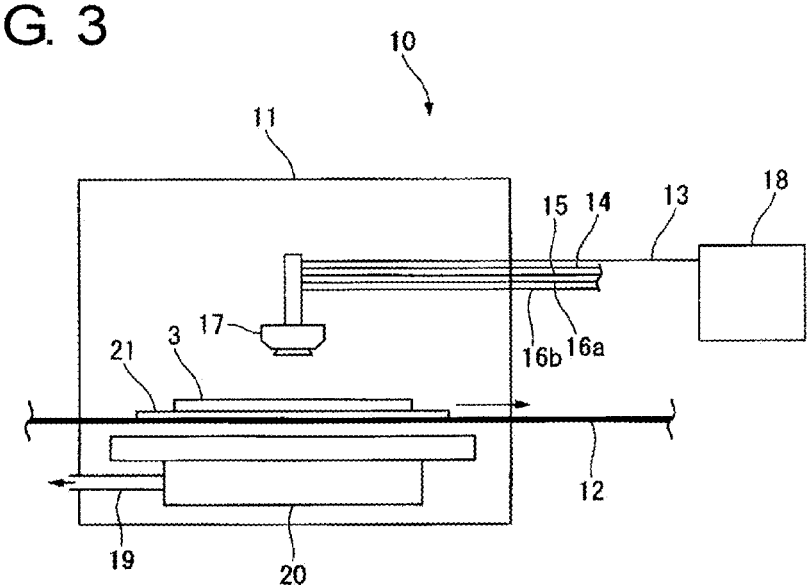
FIG. 3 is a diagrammatic view illustrating an example of electrostatic coating apparatus.

Electrostatic Coating Apparatus:

FIG. 3 is a diagrammatic view illustrating an example of electrostatic coating apparatus.

The electrostatic coating apparatus 10 includes a coating booth 11, a chain conveyor 12, a plurality of electrostatic spray guns 17, a high-voltage generator 18, and an exhaust box 20.

The chain conveyor 12 pierces the coating booth 11, and has been configured so as to convey a conductive base 21 and a curved substrate 3 disposed thereon, in a given direction.

The plurality of electrostatic spray guns 17 have been disposed in a row along a direction crossing the conveying direction of the curved substrate 3, in the coating booth 11 over the chain conveyor 12. A high-voltage cable 13, a composition supply line 14, a composition recovery line 15, and two air supply lines 16a and 16b have been connected to each of the electrostatic spray guns 17.

The high-voltage generator 18 has been connected to the electrostatic spray guns 17 via the high-voltage cables 13, and has been grounded.

The exhaust box 20 has been disposed under the electrostatic spray guns 17 and chain conveyor 12, and an exhaust duct 19 has been connected thereto.

The electrostatic spray guns 17 have been fixed to a nozzle set frame (not shown). The electrostatic coating apparatus has been configured so that the distance from the nozzle tip of each electrostatic spray gun 17 to the curved substrate 3, the angle of each electrostatic spray gun 17 with the curved substrate 3, the direction of the row of the plurality of electrostatic spray guns 17 relative to the conveying direction of the curved substrate 3, etc. can be regulated by means of the nozzle set frame.

A high voltage is applied to the nozzle tips of the electrostatic spray guns 17 and to the composition supply lines 14 and recovery lines 15. Because of this, the connection portion which connects each of the electrostatic spray guns 17, supply lines 14, and recovery lines 15 to a part made of metal (e.g., a metallic portion of the nozzle set frame, sidewall through-hole part of the coating booth 11, etc.) has been insulated with a resin or the like.

The electrostatic spray guns 17 may move so as to conform to the curved substrate 3. For example, the electrostatic spray guns 17 may have been fixed to the ends of arms of a robot or to reciprocators.

The chain conveyor 12 is composed of a plurality of plastic chains, and some or all of the plurality of plastic chains are conductive plastic chains. Each conductive plastic chain has been grounded via a metallic chain (not shown) fitted into the plastic chain and via a grounding cable (not shown) for the driving motor for the chains.

The chain conveyor 12 may be made of metal. For example, the chain conveyor may be metallic chains. The metal is preferably a material having resistance to the coating fluid, and is, for example, stainless steel (SUS). The metallic chains have been grounded via the grounding cable (not shown) for the driving motor therefor.

The conductive base 21 is a pedestal on which the curved substrate 3 can be disposed and in which at least a surface has electrical conductivity and which has been configured so that the surface has a shape conforming to the second main surface 3b (contact surface) of the curved substrate. The conductive base 21 is used in order to sufficiently ground the curved substrate via the conductive plastic chains or metallic chains of the chain conveyor 12 and via the grounding cable of the driving motor. In cases where the conductive base 21 has been grounded, this conductive base 21 need not be in direct contact with the chain conveyor and may be disposed, for example, on rectangular pipes. In cases where deposition is conducted while keeping the curved substrate 3 in a sufficiently grounded state, that is, while keeping the conductive base 21 and the curved substrate 3 in close contact with each other without leaving a space therebetween, the composition adheres evenly to the curved substrate 3.

The material of the conductive base 21 is not particularly limited. It is, however, preferable that the conductive base 21 is made of a metal or carbon, from the standpoints of imparting electrical conductivity thereto and efficiently transferring heat thereto from a heat source. Preferred from the standpoint of preventing the glass from suffering scratches is carbon, which has a lower Vickers hardness than the glass. Also usable as the conductive base 21 is an insulating pedestal, e.g., glass, which has been covered with a metal film such as an aluminum foil or coated with a metal such as copper by vapor deposition or the like.

Preferred as the conductive base 21 is a conductive base 21 which has a surface that comes into contact with the whole second main surface 3b of the curved substrate 3, because this conductive base 21 is capable of inhibiting the curved substrate 3 from suffering a temperature drop and of thereby rendering the temperature distribution even and from the standpoint of ensuring electrical evenness so that the composition can be evenly adhered to the curved substrate. Although this conductive base 21 may be a film material having flexibility, it is preferred to use a pedestal which has been processed beforehand so as to have the desired surface that comes into contact with the whole second main surface of the curved substrate 3. It is more preferred to use a bulk material having flexibility as the conductive base 21, because the contact surface can be suitably regulated in accordance with the shape of the curved substrate. Although a surface of the conductive base 21 need not be in contact with the whole second main surface 3b of the curved substrate 3, it is preferable that the second main surface 3b at least in the bent portion 9 should be in even contact with the conductive base 21, from the standpoint of forming an even film on the first main surface 3a. It is more preferred to bring the conductive base 21 into even contact with the bent portion 9 and the inclined portion 8.

Electrostatic Spray Gun

Figure 4:
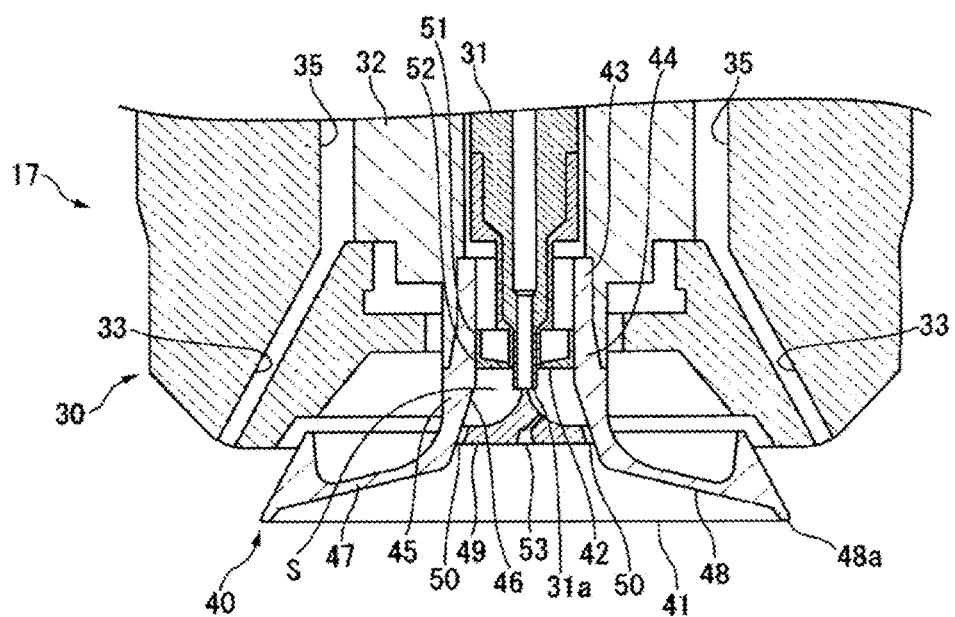
FIG. 4 is a schematic cross-sectional view of the electrostatic spray gun 17 provided to the electrostatic coating apparatus of FIG. 3.
Figure 5:
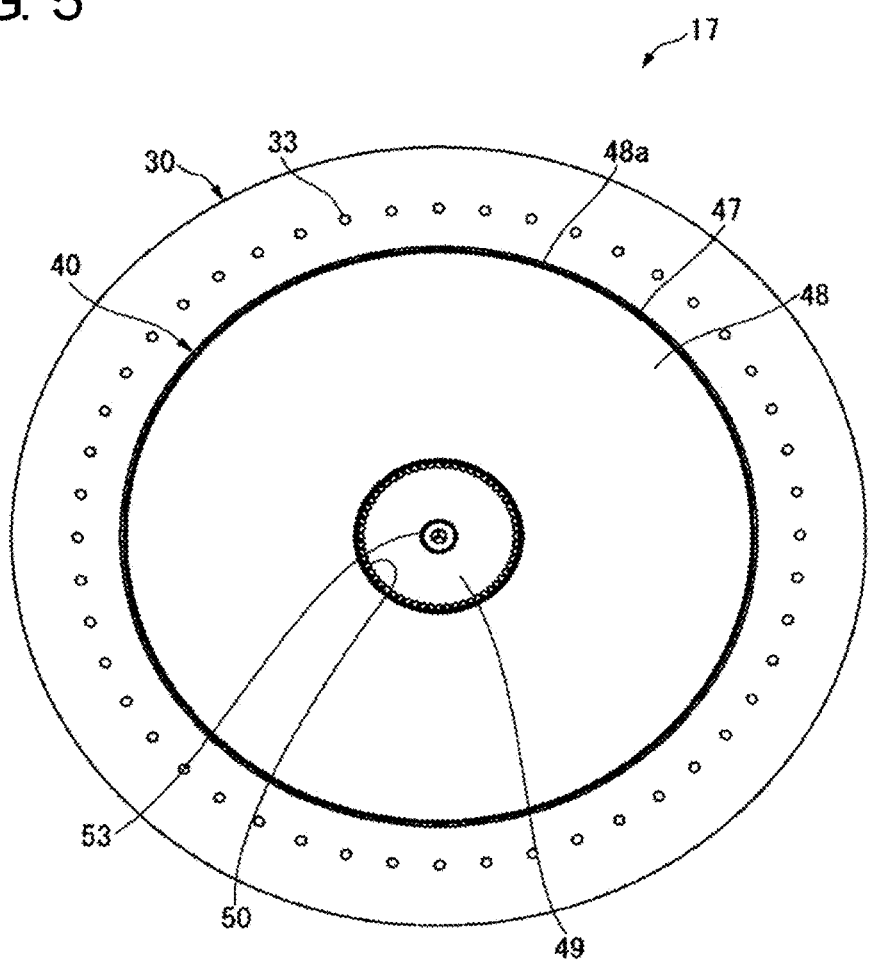
FIG. 5 is a schematic front view showing the electrostatic spray gun 17 of FIG. 4 as viewed from the front.

FIG. 4 is a schematic cross-sectional view of an electrostatic spray gun 17. FIG. 5 is a schematic front view showing the electrostatic spray gun 17 as viewed from the front.

The electrostatic spray gun 17 includes a gun body 30 and a rotary atomizing head 40. The rotary atomizing head 40 has been disposed at the front end of the gun body 30, with the axis thereof being directed in the anteroposterior direction.

The electrostatic spray gun 17 has been configured so that by rotating the rotary atomizing head 40, the composition supplied to the rotary atomizing head 40 is atomized and discharged (i.e., sprayed) by centrifugal force.

In explanations on the electrostatic spray gun 17, "front" in "front direction", "front end", etc. indicates the spraying direction of the composition, and the direction opposite thereto is the back direction. In FIG. 3 and FIG. 4, the downward direction is the front direction in the electrostatic spray gun 17.

In the gun body 30, a composition supply pipe 31 has been fixed and disposed coaxially with the rotary atomizing head 40.

An air turbine motor (not shown) has been provided to the inside of the gun body 30, and a rotating shaft 32 has been provided to the air turbine motor. Furthermore, one (e.g., the supply line 16a) of the two air supply lines 16a and 16b has been connected to the air turbine motor so that the rotational speed of the rotating shaft 32 can be controlled by the pressure of the air supplied through the supply line 16a. The rotating shaft 32 has been disposed coaxially with the rotary atomizing head 40 so as to surround the composition supply tube 31.

Here, an example has been shown in which an air turbine motor is used as a rotation driving means for the rotary shaft 32. However, a rotation driving means which is not an air turbine motor may be used.

In the gun body 30, a plurality of air outlets 33 for shaving air (also called molding air) have been formed, and air supply channels 35 for supplying shaving air respectively to the plurality of air outlets 33 have been formed. Furthermore, one (e.g., the supply line 16b) of the two air supply lines 16a and 16b has been connected to the air supply channels 35 so that air (shaving air) can be supplied to the air outlets 33 through the air supply channels 35.

The plurality of air outlets 33 have been formed so as to open at equal intervals on a concentric circle around the axis at the center, in a front view of the electrostatic spray gun 17. In a side view of the electrostatic spray gun 17, the plurality of air outlets 33 have been formed so as to gradually depart from the axis toward the front of the electrostatic spray gun 17.

The rotary atomizing head 40 includes a first member 41 and a second member 42. The first member 41 and the second member 42 are each cylindrical.

The first member 41 includes a shaft mounting part 43, a holding part 44 projecting forward from the shaft mounting part 43, a circumferential wall 45 projecting forward from the holding part 44, a widening part 47 projecting forward from the circumferential wall 45, and a front wall 49 which partitions the center hole of the first member 41 into a front portion and a back portion at the boundary between the circumferential wall 45 and the widening part 47; the shaft mounting part 43, holding part 44, circumferential wall 45, widening part 47, and front wall 49 have been integrated together.

The holding part 44 is for holding the second member 42 coaxially to the first member 41.

The inner circumferential surface of the circumferential wall 45 constitutes a tapered guide surface 46 that gradually increases in diameter toward the front over the entire region in the axial direction of the rotary atomizing head 40.

The widening part 47 increases in diameter toward the front so as to have a cup shape, and the front surface of the widening part 47 constitutes a diffusing surface 48 which gradually increases in diameter toward the front.

The outer peripheral edge 48a of the diffusing surface 48 of the widening part 47 has a large number of fine cuts for reducing the composition into fine droplets, the fine cuts having been disposed at substantially equal intervals over the entire circumference.

The front wall 49 has outflow holes 50 which pierce the outer peripheral edge of the front wall 49 back and forth. The plurality of outflow holes 50 are each circular, and have been formed at a constant angular pitch along the circumferential direction. The piercing directions of the outflow holes 50 are parallel with the directions along which the guide surface 46 of the circumferential wall 45 inclines.

The central portion of the rear surface of the front wall 49 has a conical shape projecting rearward. Furthermore, the central portion has a through-hole 53 formed therein which extends from the center of the front surface of the front wall 49 toward the rear and is branched somewhere in the front wall 49 into three, which open in the circumferential surface of the conical portion.

The second member 42 includes a cylindrical part 51 and a rear wall 52 which have been integrated together. The rear wall 52 has been disposed at the front end of the cylindrical part 51. A circular through-hole has been formed in the center of the rear wall 52 so that the front end portion of the composition supply tube 31 can be inserted thereinto.

In the rotary atomizing head 40, the space surrounded by the front wall 49, the circumferential wall 45, and the rear wall 52 is a reservoir chamber S. This reservoir chamber S communicates with the diffusing surface 48 via the plurality of outflow holes 50.

In the electrostatic spray gun 17, the front end portion of the composition supply tube 31 has been inserted into the through-hole formed at the center of the rear wall 52, so that the discharge port 31a at the front end of the composition supply tube 31 is open in the reservoir chamber S. Thus, the composition can be supplied to the reservoir chamber S via the composition supply tube 31.

The electrostatic coating apparatus and the electrostatic spray gun are not limited to the illustrated examples. As the electrostatic coating apparatus, use may be made of any known electrostatic coating apparatus equipped with an electrostatic spray gun having a rotary atomizing head. As the electrostatic spray gun, use may be made of any known electrostatic spray gun having a rotary atomizing head. The electrostatic spray gun may be gripped by, for example, a six-axis coating robot (e.g., one manufactured by Kawasaki Robotics Inc.) to spray the composition.

Coating Method:

In the electrostatic coating apparatus 10, the composition is applied to a curved substrate 3 in the following manner.

Figure 6:
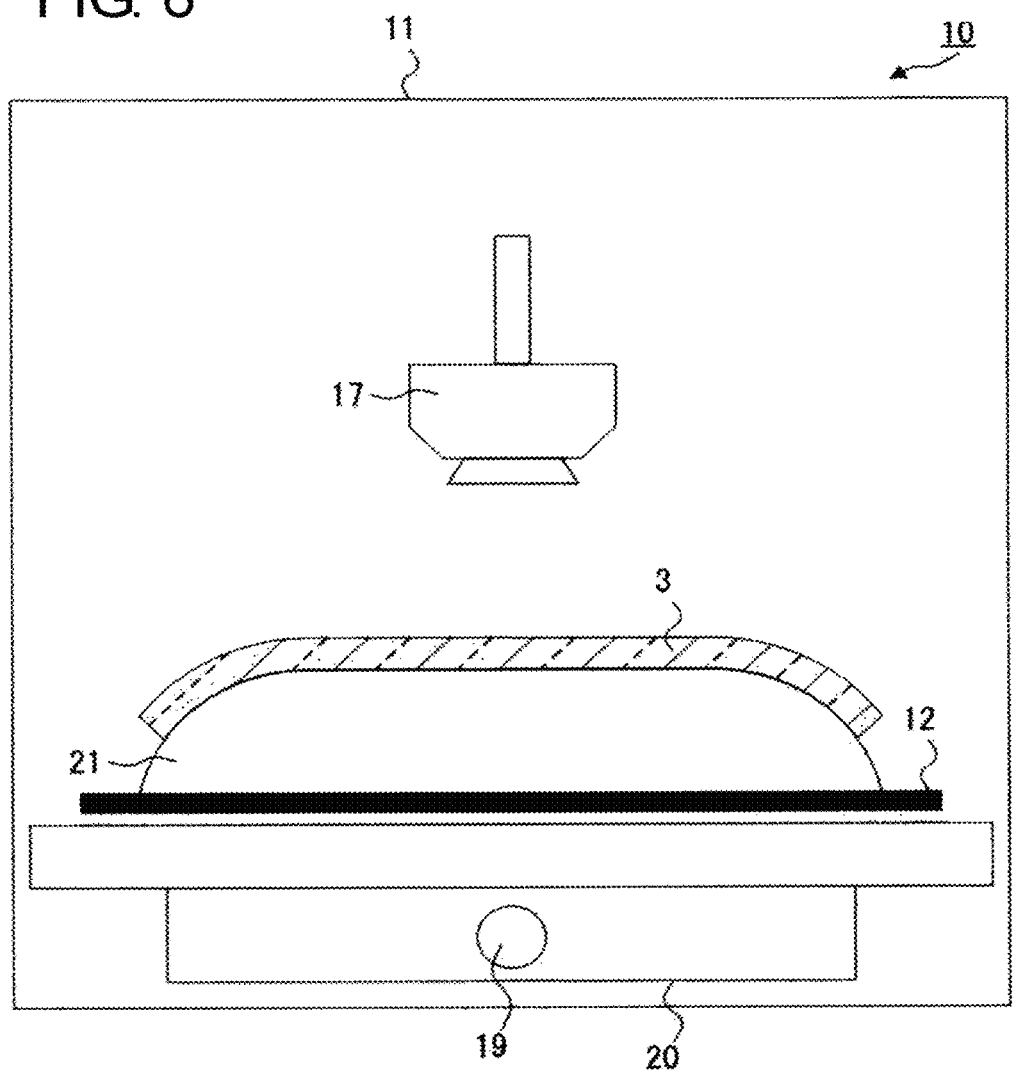
FIG. 6 is a schematic side view of the electrostatic coating apparatus of FIG. 3 as viewed from the upstream side along a chain conveyor.

As shown in FIG. 6, the curved substrate 3 is disposed on the conductive base 21. A high voltage is applied to the electrostatic spray gun 17 with the high-voltage generator 18. At the same time, the composition is supplied to the electrostatic spray gun 17 through the composition supply line 14, and air is supplied to the electrostatic spray gun 17 through each of the two air supply lines 16a and 16b.

The air supplied through the air supply line 16b is supplied to the air supply channel 35 within the gun body 30 and then blown out as shaving air from the openings of the air outlets 33.

The air supplied through the air supply line 16a drives the air turbine motor within the gun body 30 to rotate the rotating shaft 32. Thus, the composition which has supplied from the composition supply line 14 to the reservoir chamber S through the composition supply tube 31 moves forward due to centrifugal force along the guide surface 46 of the circumferential wall 45, passes through the outflow holes 50, and is supplied to the diffusing surface 48. Some of the composition can pass through the through-hole 53 of the central portion and then supplied to the diffusing surface 48. Since the guide surface 46 of the circumferential wall 45 has a tapered shape that increases in diameter toward the outflow holes 50, the composition within the reservoir chamber S is reliably made, by centrifugal force, to reach the outflow holes 50, without remaining in the reservoir chamber S.

The composition supplied to the diffusing surface 48 moves, due to centrifugal force, toward the outer peripheral edge 48a, while being diffused along the diffusing surface 48, and forms a liquid film of the composition on the diffusing surface 48. The liquid film is divided into fine droplets at the outer peripheral edge 48a of the diffusing surface 48 of the widening part 47, and the droplets are scattered radially.

The droplets of the composition which have been scattered from the rotary atomizing head 40 are guided toward the curved substrate 3 by the flow of the shaving air. In addition, the droplets have been negatively charged and are hence attracted, by electrostatic attracting force, toward the grounded curved substrate 3. Because of this, the composition adheres efficiently to the surface of the curved substrate 3, and an even and homogeneous antiglare film can be formed on both the bent portion and the flat portion.

Some of the composition which has not been sprayed from the electrostatic spray gun 17 is recovered by sending the remaining composition to a composition tank (not shown) through the composition recovery line 15. Meanwhile, some of the composition which was sprayed from the electrostatic spray gun 17 but has not adhered to the curved substrate 3 is sucked into the exhaust box 20 and recovered through the exhaust duct 19.

The surface temperature of the curved substrate 3 is preferably from 15 to 50° C., more preferably from 20 to 40° C. In cases where the surface temperature of the curved substrate 3 is equal to or higher than the lower limit of the range, the liquid medium (B) of the composition vaporizes quickly and, hence, sufficient irregularities tend to be formed. In cases where the surface temperature of the curved substrate 3 is equal to or lower than the upper limit of the range, satisfactory adhesion is obtained between the curved substrate 3 and the antiglare film 5.

The conveying speed of the curved substrate 3 is preferably from 0.6 to 20 m/min, more preferably from 1 to 15 m/min. In cases where the conveying speed of the curved substrate 3 is 0.6 m/min or higher, the production efficiency is improved. In cases where the conveying speed of the curved substrate 3 is 20 m/min or less, it is easy to control the film thickness in which the composition is applied to the curved substrate 3.

The number of times for conveying the curved substrate 3, i.e., the number of times for coating the composition to the curved substrate 3 by passing the curved substrate 3 under the electrostatic spray gun 17, can be suitably set in accordance with the desired haze, gloss, etc. From the standpoint of antiglare properties, once or more is preferred, and twice or more is more preferred. From the standpoint of production efficiency, 6 times or less is preferred, and 5 times or less is more preferred.

The distance from the nozzle tip of the electrostatic spray gun 17 (i.e., the front end of the rotary atomizing head 40 along the spraying direction of the composition) to the curved substrate 3 is suitably regulated in accordance with the width of the curved substrate 3, the film thickness in which the composition is to be applied to the curved substrate 3, etc., and is usually from 150 to 450 mm. In cases where the distance to the curved substrate 3 is shortened, the coating efficiency increases. However, in case where the nozzle tip is made too close to the curved substrate 3, there is the heightened possibility of causing a discharge, resulting in a problem concerning safety. Meanwhile, as the distance to the curved substrate 3 becomes longer, the application area increases. However, in case where the nozzle tip is too far from the curved substrate 3, a decrease in coating efficiency becomes a problem.

The voltage to be applied to the electrostatic spray gun 17 is suitably regulated in accordance with the amount of the composition to be applied to the curved substrate 3, etc. The voltage is preferably in the range of from −30 kV to −90 kV, more preferably from −40 kV to −90 kV, even more preferably from −50 kV to −90 kV. Increasing the absolute value of the voltage tends to heighten the coating efficiency.

The rate of supplying the composition to the electrostatic spray gun 17 (hereinafter referred to also as coating fluid amount) is suitably regulated in accordance with the amount of the composition to be applied to the curved substrate 3, etc. The coating fluid amount is preferably from 3 to 200 mL/min, more preferably from 5 mL/min to 100 mL/min, even more preferably from 10 mL/min to 60 mL/min. In case where the coating fluid amount is too small, there is the possibility of resulting in uncoated areas. The maximum coating fluid amount can be an optimal value selected in accordance with the coating thickness, coating speed, fluid properties, etc.

The pressure of the air being supplied to the electrostatic spray gun 17 through each of the two air supply lines 16a and 16b is suitably regulated in accordance with the amount of the composition to be applied to the curved substrate 3, etc., and is preferably from 0.01 MPa to 0.5 MPa.

It is possible to control the composition application pattern by regulating the pressure of the air being supplied to the electrostatic spray gun 17 through each of the two air supply lines 16a and 16b.

The term "composition application pattern" means a pattern formed on the substrate by droplets of the composition sprayed from the electrostatic spray gun 17.

As the pressure of the air being supplied to the air turbine motor within the electrostatic spray gun 17 is heightened, the rotational speed of the rotating shaft 32 increases and the rotational speed of the rotary atomizing head 40 increases. As a result, the size of the droplets being scattered from the rotary atomizing head 40 decreases, and this tends to enlarge the application pattern.

By heightening the pressure of the air being supplied to the air supply channels 35 within the electrostatic spray gun 17 and thereby heightening the pressure of the air (shaving air) blown out from the air outlets 33, the spread of the droplets being scattered from the rotary atomizing head 40 tends to be narrowed, resulting in a smaller application pattern.

It is preferable that the pressure of the air being supplied to the air turbine motor should be such that the rotary atomizing head 40 has a rotational speed (hereinafter referred to also as cup rotational speed) in the range of from 5,000 to 80,000 rpm. The cup rotational speed is more preferably from 7,000 to 70,000 rpm, especially preferably from 10,000 to 50,000 rpm. In cases where the cup rotational speed is equal to or higher than the lower limit of the range, this step shows an excellent ability to form surface irregularities. In cases where the cup rotational speed is equal to or less than the upper limit of the range, this step shows excellent coating efficiency.

The cup rotational speed can be measured with a measuring instrument (not shown) attached to the electrostatic coating apparatus 10.

It is preferable that the pressure of the air being supplied to the air supply channels 35 should be such that the pressure of the shaving air (hereinafter referred to also as shaving pressure) is in the range of from 0.01 to 0.3 MPa. The shaving pressure is more preferably from 0.03 to 0.25 MPa, especially preferably from 0.05 to 0.2 MPa. In cases where the shaving pressure is equal to or higher than the lower limit of the range, a remarkable improvement in coating efficiency is brought about due to an improvement in the effect of preventing the scattering of droplets. In cases where the shaving pressure is equal to or less than the upper limit of the range, a coating width can be ensured.

(Firing Step)

In the firing step, the coating film of the composition formed on the substrate in the coating step is fired to obtain an antiglare film.

The firing may be conducted by heating the substrate at the same time when coating the substrate with the composition, or may be conducted after coating the substrate with the composition, by heating the coating film.

The firing temperature is preferably 30° C. or higher. For example, in the case where the substrate is glass, the firing temperature is more preferably from 100 to 750° C., even more preferably from 150 to 550° C.

Advantageous Effects

In the method for producing a curved substrate with an antiglare film of the invention described above, it is possible to form an antiglare film by using, as the composition to be sprayed by an electrostatic spray gun having a rotary atomizing head, a composition which includes at least one of a silica precursor (A) and particles (C) and further includes a liquid medium (B) and in which the liquid medium (B) includes a liquid medium (B1) having a boiling point of 150° C. or lower in an amount of 86 mass % or larger based on the whole liquid medium (B). The reason for this is thought to be as follows. After droplets of the composition have adhered to a substrate, the liquid medium (B1) volatilizes rapidly. The droplets are hence less apt to spread on the substrate, and form a film while sufficiently maintaining the shape of the droplets which have just adhered (that is, the liquid medium (B) is wholly removed, and in the case where a silica precursor (A) is contained, the silica precursor (A) becomes a matrix).

In the process of the invention for producing a curved substrate with an antiglare film, since an electrostatic spray gun having a rotary atomizing head is used, the application pattern has a large size (e.g., width). For example, in the spraying method using a two-fluid spray nozzle which has conventionally been in common use for forming antiglare films, the width of the application pattern is about 7 mm at the most. In contrast, in the case of using an electrostatic spray gun having a rotary atomizing head, the application pattern can be made to have a width of, for example, 350 mm.

Furthermore, since the droplets of the composition sprayed from the electrostatic spray gun have been negatively charged, the droplets are attracted, by electrostatic attracting force, toward the substrate which has been grounded. Because of this, the droplets adhere efficiently to the substrate as compared with the case where the composition is sprayed without being charged.

Consequently, in the process of the invention for producing a curved substrate with an antiglare film, it is possible to reduce the number of coating operations and the amount of the composition to be applied which are necessary for forming an antiglare film having any desired haze or 60° mirror surface glossiness.

A comparison between the antiglare performance of the curved substrate with an antiglare film obtained by the process of the invention for producing a curved substrate with an antiglare film and the antiglare performance of a curved substrate coated with an antiglare film formed using a two-fluid spray nozzle shows the following. Even if the two curved substrate with a films are equal in haze and 60° mirror surface glossiness, the curved substrate with a film obtained by the process of the invention for producing a curved substrate with an antiglare film tends to have higher antiglare performance and be more effective in preventing the trouble that external light, indoor illuminators, or the like is reflected in the screen and the visibility is reduced by the reflected images.

This is thought to be due to a difference in the shape of the irregularities of the antiglare film. Specifically, investigations made by the present inventors revealed the following. In the spraying method using a two-fluid spray nozzle, droplets are pelted on the substrate and hence come to have the shape of crowns upon deposition of the composition on the substrate. Simultaneously therewith, the liquid medium volatilizes to form crown-shaped irregularities. Meanwhile, in the case of using an electrostatic spray gun having a rotary atomizing head, droplets fall relatively slowly on the substrate and, hence, the droplets come to have the shape of domes upon deposition on the substrate. Simultaneously therewith, the liquid medium volatilizes to form dome-shaped protrusions. Formation of such different shapes is thought to have affected the antiglare performance. In particular, even in the case where there are a flat portion 7 and a bent portion 9 as in the curved substrate 3, droplets can be evenly deposited by the electrostatic coating method since electrostatic force is utilized, and a homogeneous and even antiglare film can be produced.

As stated above, the surface structure of the antiglare film produced using an electrostatic spray gun having a rotary atomizing head has a feature. When the surface structure of the antiglare film obtained by this method is examined with a laser microscope or the like, then a "first protrusion" which is a dome-shaped protrusion and a "second protrusion" which is an island-shaped protrusion formed on the first protrusion are observed.

For example, in the case where an antiglare film having a haze of 10% or higher is produced using an electrostatic spray gun having a rotary atomizing head, this antiglare film has a rugged surface structure having the following first protrusion and second protrusion.

First protrusion: a protrusion which, in a section along a height of [bearing height]+0.05 µm, has a diameter (in terms of complete circle) of larger than 10 µm and 185 µm or less and which has a maximum height of from 0.2 to 8.0 µm from the lowest portion in the examination area as a reference.

Second protrusion: a protrusion which, in a section along a height of [bearing height]+0.5 µm, has a diameter (in terms of complete circle) of larger than 1 µm and which is present in a number density of from 0.0004 to 1.2 protrusions per µm$^2$ and have an average height of from 0.1 to 8 µm from the bearing height as a reference.

Similar surface structure is observed in an antiglare film having a haze less than 10% produced by an electrostatic spray gun having a rotary atomizing head. In this antiglare film, the "first protrusion" and the "second protrusion" are observed although these protrusions differ in size from those in the antiglare film having a haze of 10% or higher described above.

<Applications>

Applications of the curved substrate with an antiglare film of the invention are not particularly limited. Examples thereof include vehicular transparent parts (headlight covers, side mirrors, front transparent substrates, side transparent substrates, rear transparent substrates, instrument panel surfaces, etc.), meters, building windows, show windows, displays (notebook PC, monitors, LCD, PDP, ELD, CRT, PDA, etc.), LCD color filters, substrates for tough panels, pickup lenses, optical lenses, spectacle lenses, camera parts, video parts, CCD cover substrates, optical fiber end faces, projector components, copier parts, transparent substrates (cover glasses, etc.) for solar cells, mobile phone windows, backlight unit components (lightguide plates, cold cathode tubes, etc.), backlight unit component liquid-crystal brightness-improving films (prisms, translucent films, etc.), liquid-crystal brightness-improving films, organic EL light emitting device components, inorganic EL light emitting device components, fluorescent-material light emitting device components, optical filters, end faces of optical components, illumination lamps, illuminator covers, amplified laser light sources, antireflection films, polarizing films, and agricultural films.

The image display device according to this embodiment includes an image display device main body which displays images and the curved substrate with an antiglare film of the present invention disposed on the viewing side of the image display device main body.

Examples of the image display device main body include liquid-crystal panels, organic EL (electroluminescence) panels, and plasma display panels.

The curved substrate with a film may be disposed integrally with the image display device main body, as a protective plate for the image display device main body, or may be disposed as any of various filters on the viewing side of the image display device main body. Furthermore, the image display device may be one in which different image display parts have been provided respectively to the flat portion and inclined portion of the curved substrate with a film.

The image display device explained above has satisfactory visibility since the curved substrate with a film of the invention, which has excellent antiglare performance, has been disposed on the viewing side of the image display device main body.

EXAMPLES

The present invention will be explained below in detail with reference to Examples. However, the invention should not be construed as being limited by the following Examples.

Among Examples 1 to 3, Example 1 and Example 2 are Examples according to the present invention and Example 3 is Comparative Example.

The evaluation methods and materials used in the Examples are shown below.

<Evaluation Methods>

(Visual Examination)

A curved substrate with an antiglare film was disposed on a table set under a fluorescent lamp, with the antiglare layer facing upward. This curved substrate with an antiglare film was visually examined for reflection of the fluorescent lamp in the surface thereof to evaluate homogeneity in the flat portion, homogeneity over the flat portion and bent portion, etc. in accordance with the following criteria.

◯: The substrate surface has no film unevenness and no defects and is homogeneous.

Δ: The substrate surface is even as a whole, although slightly having filmunevenness or defects.

×: The substrate surface is uneven, or has a portion not covered with the film.

(Measurement of Reflected-Image Diffusibility Index Value R)

A measurement of reflected-image diffusibility index value R was made with SMS-1000 Ver. 3.0, manufactured by Display-Messtechnik & Systeme GmbH & Co., on the flat portion and bent portion of each curved substrate.

The ratio of reflected-image diffusibility index value R was determined from the results of the measurement of reflected-image diffusibility index value R by calculating the value of (reflected-image diffusibility index value R of the bent portion)/(sum of reflected-image diffusibility index value R of the flat portion and reflected-image diffusibility index value R of the bent portion).

Production of Substrates Coated with Film Deposited by Electrostatic Coating Method; Example 1 and Example 2

[Materials used]

(Production of Dispersion (a) of Flaky Silica Particles)

By the same steps as in the Example 1 described in JP-A-2014-094845, a silica dispersion was produced, thereafter acid-treated, washed, alkali-treated, wet-disaggregated, and finally subjected to cation exchange to produce a silica dispersion. The silica dispersion which had undergone the cation exchange was treated with an ultrafiltration membrane (MOLSEP (registered trademark), manufactured by Daisen Membrane System; cut-off molecular weight, 150,000) to adjust the concentration.

From the silica dispersion obtained (dispersion (a) of flaky silica particles), silica particles were taken out. The silica particles were examined with a TEM and, as a result, it was ascertained that the silica particles were composed solely of flaky silica particles containing substantially no silica particles of an indefinite shape.

The average particle diameter of the flaky silica particles contained in the flaky-silica-particle dispersion (a) was 0.182 µm, which was the same as after the wet disaggregation. The average aspect ratio thereof was 188.

The flaky-silica-particle dispersion (a) had a solid concentration of 5.0 mass %, as measured with an infrared moisture meter.

(Preparation of Base Liquid (b))

While stirring 34.3 g of denatured ethanol (SOLMIX (registered trademark) AP-11, manufactured by Japan Alcohol Trading Co., Ltd.; a mixed solvent containing ethanol as main component; boiling point, 78° C.; the same applies hereinafter), 4.2 g of silicate 40 (manufactured by Tama Chemicals Co., Ltd.; a mixture of tetraethoxysilane and a hydrolysis and condensation product thereof; solid concentration (in terms of $SiO_2$), 40 mass %; solvent, ethanol (10% or less); the same applies hereinafter) and 2.0 g of the flaky-silica-particle dispersion (a) were added thereto. This mixture was stirred for 30 minutes. A liquid mixture of 3.6 g of ion-exchanged water and 0.06 g of an aqueous nitric acid solution (nitric acid concentration, 61 mass %) were added thereto. The resultant mixture was stirred for 60 minutes to prepare a base liquid (b) having a solid concentration (in terms of $SiO_2$) of 4.0 mass %. This solid concentration given in terms of $SiO_2$ is a solid concentration calculated on the assumption that all the Si contained in the silicate 40 has been converted to $SiO_2$.

(Preparation of Silane Compound Solution (c))

While stirring 3.85 g of denatured ethanol, a liquid mixture of 0.4 g of ion-exchanged water and 0.01 g of an aqueous nitric acid solution (nitric acid concentration, 61 mass %) was added thereto. This mixture was stirred for 5 minutes. Subsequently, 0.5 g of 1,6-bis(trimethoxysilyl)hexane (KBM-3066, manufactured by Shin-Etsu Chemical Co., Ltd.; solid concentration (in terms of $SiO_2$), 37 mass %) was added thereto, and the resultant mixture was stirred in a water bath at 60° C. for 15 minutes to prepare a silane compound solution (c) having a solid concentration (in terms of $SiO_2$) of 4.3 mass %.

(Preparation of Composition (d))

While stirring 44.1 g of the base liquid (b), 4.8 g of the silane compound solution (c) was added thereto. This mixture was stirred for 60 minutes. To the mixture, 146.7 g of denatured ethanol was added. The resultant mixture was stirred at room temperature for 30 minutes to obtain a composition (d) having a solid concentration (in terms of $SiO_2$) of 1.0 mass %.

[Preparation of Substrate]

Figure 7A:
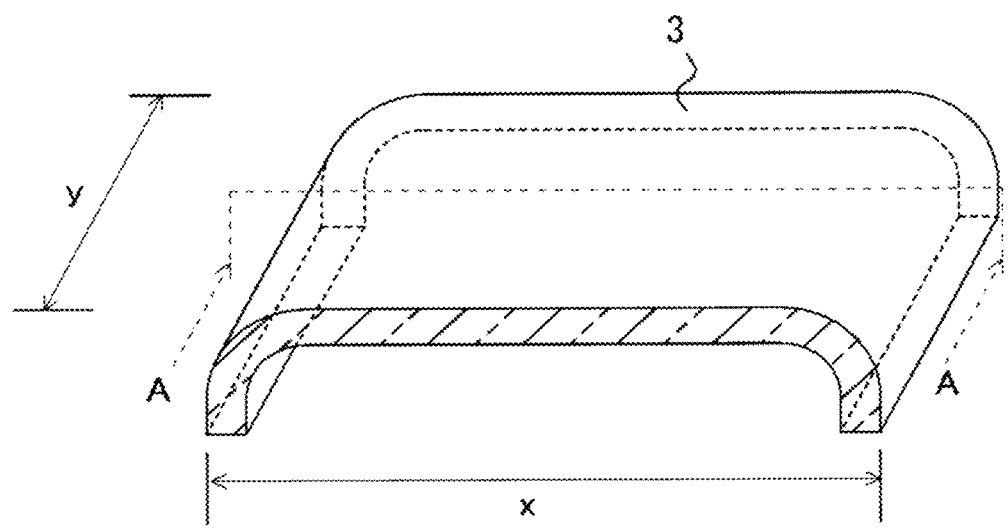
FIG. 7A and FIG. 7B are views for illustrating portions of a curved substrate.
Figure 7B:
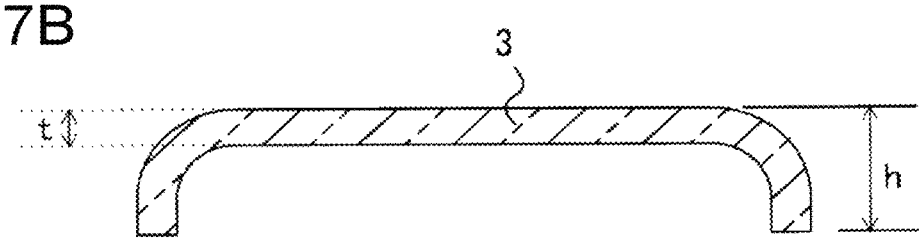

As a curved substrate, an aluminosilicate glass (DRAGONTRAIL (trade name), manufactured by Asahi Glass Co., Ltd.; glass substrate having sizes of x=150 mm, y=100 mm (bending depth h=10 mm), thickness t=1.1 mm) which had a shape including bent portions and a flat portion as shown in FIG. 7A and FIG. 7B was prepared. The curved substrate was subjected to a chemical strengthening treatment to form a compressive stress layer having a CS of 750 MPa and a DOL of 28 μm. The surfaces of this glass were washed with an aqueous dispersion of cerium oxide, subsequently rinsed with ion-exchanged water, and dried.

[Electrostatic Coating Apparatus]

An electrostatic coating apparatus (electrostatic liquid coater manufactured by Asahi Sunac Co.) having the same configuration as the electrostatic coating apparatus 10 shown in FIG. 3 was prepared. Prepared as electrostatic spray guns were rotary atomizing automatic electrostatic guns (Sunberu ESA120, manufactured by Asahi Sunac Co.; 70ϕ cup).

As conductive bases 21, (I) a conductive base 21 made of carbon and (II) a conductive base 21 obtained by covering a glass base with an aluminum foil were prepared. These conductive bases had been processed so as to have a shape conforming to the contact surface of the curved substrate on which a film was to be deposited.

[Electrostatic Coating]

Example 1

The inside of the coating booth of the electrostatic coating apparatus was regulated so as to have a temperature of 25±1° C. and a humidity of 50±10%.

Figure 8A:
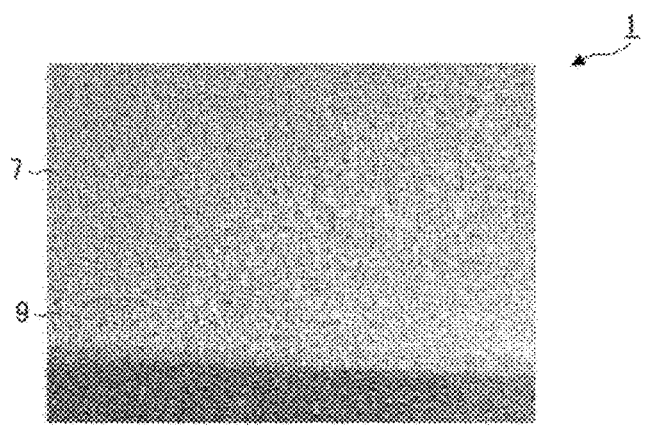
FIG. 8A and FIG. 8B show appearance photographs of a curved substrate with a film obtained in Example 1.
Figure 8B:

The curved substrate was disposed on the chain conveyor of the electrostatic coating apparatus, with the conductive base 21 made of carbon (I) interposed therebetween. While conveying the curved substrate with the chain conveyor at a constant speed, the composition (d) was applied to the top surface of the curved substrate (the surface on the side opposite to the surface which had been in contact with the molten tin during the production by a float process) by an electrostatic coating method under the coating conditions shown in Table 1. Thereafter, the composition applied was fired in the air at 450° C. for 30 minutes to obtain a curved substrate with an antiglare film. Photographs of the appearance of the substrate obtained are shown in FIG. 8A and FIG. 8B.

Example 2

Figure 9A:
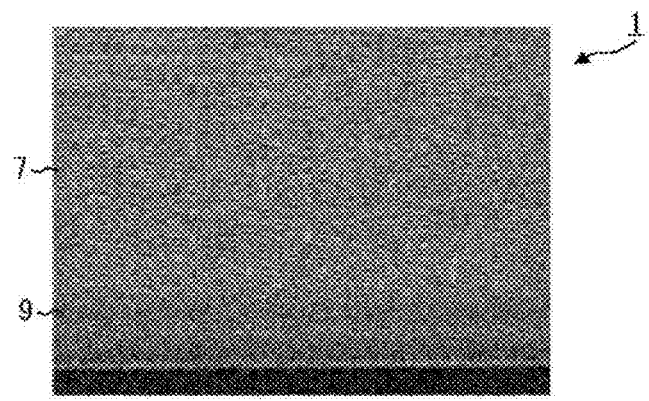
FIG. 9A is a plan view of a curved substrate with a film obtained in Example 2.

Electrostatic coating was conducted under the same conditions as in Example 1, except that the base (II) was used as a conductive base 21. A photograph of the appearance of the substrate obtained is shown in FIG. 9A.

The conditions used in Example 1 and Example 2 are shown in Table 1.

TABLE 1

|  | Example 1 | Example 2 |
|---|---|---|
| Conducting base | (I) | (II) |
| Applied voltage (kV) | −60 | −60 |
| Coating fluid amount (mL/min) | 25 | 25 |
| Distance from nozzle tip to glass plate (mm) | 250 | 250 |
| Cup rotational speed (krpm) | 35 | 35 |
| Number of times of conveying substrate | 4 | 4 |

<Production of Substrate Coated with Film Deposited by Spraying Method; Example 3>

[Materials used]

(Preparation of Base Liquid (e))

While stirring 34.3 g of denatured ethanol, 4.5 g of silicate 40 was added thereto. This mixture was stirred for 30 minutes. A liquid mixture of 3.6 g of ion-exchanged water and 0.06 g of an aqueous nitric acid solution (nitric acid concentration, 61 mass %) were added thereto. The resultant mixture was stirred at room temperature for 60 minutes to obtain a base liquid (e) having a solid concentration (in terms of $SiO_2$) of 4.0 mass %. This solid concentration given in terms of $SiO_2$ is a solid concentration calculated on the assumption that all the Si contained in the silicate 40 has been converted to $SiO_2$.

(Preparation of Composition (f))

To the base liquid (e), 151.1 g of denatured ethanol was added. This mixture was stirred at room temperature for 30 minutes to obtain a composition (f) having a solid concentration (in terms of $SiO_2$) of 1.0 mass %.

[Spray Device]

As a spray device, a six-axis coating robot (JF-5, manufactured by Kawasaki Robotics Inc.) was used. As a nozzle, a VAU nozzle (two-fluid spray nozzle manufactured by Spraying Systems Japan) was used.

[Spray Coating]

Example 3

Figure 10:
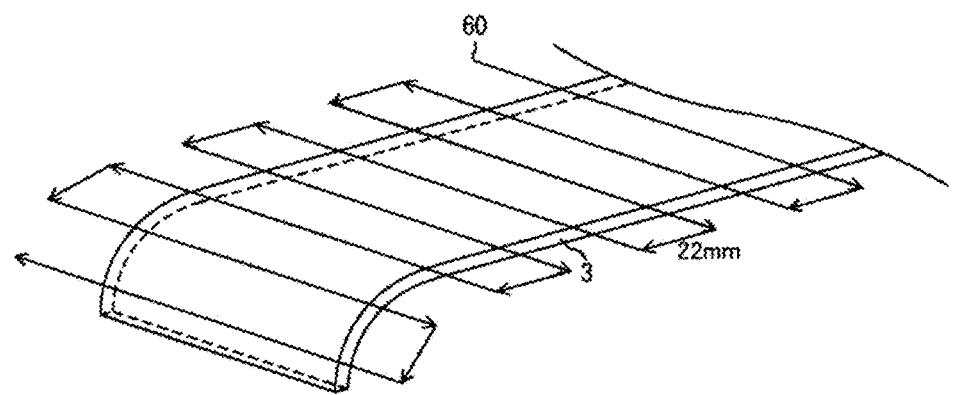
FIG. 10 is a view illustrating a nozzle locus for use in spray-coating a curved substrate.

The composition (f) was applied by spray coating while moving the nozzle in accordance with the nozzle locus 60 shown in FIG. 10.

The air discharge pressure of the VAU nozzle is set at 0.4 MPa, and the nozzle is moved over the cleaned curved substrate 3 in the transverse direction at a speed of 750 mm/min, subsequently moved forward by 22 mm, and moved from there over the curved substrate 3 in the transverse direction at a speed of 750 mm/min. The VAU nozzle is thus moved until the entire surface of the cleaned curved substrate 3 which has been heated beforehand to 90±3° C. is scanned with the VAU nozzle. A coated substrate obtained by coating the entire surface of the substrate with the composition by this method is referred to as a one-layer-coated article. A coated substrate obtained by coating with the composition once more to the one-layer-coated article in the same manner is referred to as a two-layer-coated article. By repeatedly coating with the composition to the two-layer-coated article in the same manner, an article coated with three of more layers is obtained.

Figure 9B:
FIG. 9B is a plan view of a curved substrate with an antiglare film obtained in Example 3.

The composition (f) was applied under the application conditions shown in Table 2 and then fired in the air at 450° C. for 30 minutes to obtain a curved substrate with an antiglare film. A photograph of the appearance of the substrate obtained is shown in FIG. 9B.

TABLE 2

|  | Example 3 |
|---|---|
| Number of coating layers | 18 |
| Coating fluid amount (mL/min) | 25 |
| Distance from nozzle tip to glass plate (mm) | 145 |
| Temperature of substrate surface (° C.) | 90 |

<Evaluation Results>

The curved substrate with an antiglare film each obtained in Examples 1 to 3 was visually examined and evaluated for reflected-image diffusibility index value R. The results thereof are shown in Table 3. In the curved substrate with an antiglare film obtained in Example 1, homogeneous antiglare properties free from an unusual feeling were visually observed in both the flat portion and the bent portions. The antiglare film was highly beautiful in which no defects or the like was observed. In cases where the overall flat and bent portions were examined, the curved substrate with an antiglare film showed exceedingly satisfactory visual homogeneity and had a highly beautiful appearance.

In the curved substrate with an antiglare film obtained in Example 2, slight film unevenness was observed in the flat portion and bent portions. However, in cases where the overall flat and bent portions were examined, the curved substrate with an antiglare film showed exceedingly satisfactory visual homogeneity.

In contrast, in the curved substrate with an antiglare film obtained in Example 3, the flat portion had a homogeneous appearance but completely uncoated areas were observed in the bent portions.

With respect to each curved substrate with an antiglare film obtained in Example 1 to Example 3, the flat portion and the bent portions were examined for reflected-image diffusibility index value R. These measured values of reflected-image diffusibility index value R were substituted into the equation for determining the "ratio of reflected-image diffusibility index value R", thereby giving the results shown in Table 3. This ratio is thought to reflect the results of the visual examination; the closer the ratio to 0.5, the more the antiglare film is homogeneous. It was found from the results of the calculation that Example 1 and Example 2 had ratios close to 0.5 and were homogeneous, whereas Example 3 was inhomogeneous.

TABLE 3

|  |  | Example 1 | Example 2 | Example 3 |
|---|---|---|---|---|
| Visual examination | Flat portion only | ○ | Δ | ○ |
|  | Bent portion only | ○ | ○ | X |
|  | Overall appearance | ○ | Δ | X |
| Results of measurement of reflected-image diffusibility index value R | Flat portion | 0.06 | 0.6 | 0.8 |
|  | Bent portion | 0.09 | 0.4 | 0.06 |
| Ratio of reflected-image diffusibility index value R | (Bent portion)/ [(flat portion) + (bent portion)] | 0.6 | 0.4 | 0.07 |

Other Examples are then explained below. Example 4 to Example 12 are Examples of another embodiment of the present invention and Comparative Examples. Example 4 to Example 6 are Examples according to the present invention, and Example 7 to Example 12 are Comparative Examples. Table 4 to Table 6 show the film configurations of these Examples. Examples 4 to 12 were produced using a sputtering device equipped with a target which faced a flat portion and a target which faced an inclined portion and with adjustable distribution correction plates for the respective targets. Examples 4 to 6, which are Examples according to the invention, were produced by conducting deposition simultaneously on the flat portion and the inclined portion while separately controlling the deposition conditions for the target facing the flat portion and the target facing the inclined portion and while separately adjusting the distribution correction plates. In this embodiment, niobium oxide ($Nb_2O_5$) was used as high-refractive-index layers and silicon oxide ($SiO_2$) was used as low-refractive-index layers.

TABLE 4

| | Example 4: film configuration (nm) | | | | Example 5: film configuration (nm) | | | | Example 6: film configuration (nm) | | | |
|---|---|---|---|---|---|---|---|---|---|---|---|---|
| | $Nb_2O_5$ | $SiO_2$ | $Nb_2O_5$ | $SiO_2$ | $Nb_2O_5$ | $SiO_2$ | $Nb_2O_5$ | $SiO_2$ | $Nb_2O_5$ | $SiO_2$ | $Nb_2O_5$ | $SiO_2$ |
| Flat portion | 20 | 15 | 70 | 87.5 | 15.6 | 13.6 | 74 | 85 | 20 | 22.5 | 80 | 60 |
| Bent portion | 18.875 | 15.625 | 77.75 | 83.125 | 16.3 | 15.2 | 77 | 89.4 | 22.5 | 19.375 | 75 | 77.5 |
| Inclined portion | 17.75 | 16.25 | 85.5 | 78.75 | 17 | 16.8 | 80 | 93.8 | 25 | 16.25 | 70 | 95 |

TABLE 5

|  | Example 7: film configuration (nm) | | | | Example 8: film configuration (nm) | | | | Example 9: film configuration (nm) | | | |
| --- | --- | --- | --- | --- | --- | --- | --- | --- | --- | --- | --- | --- |
|  | $Nb_2O_5$ | $SiO_2$ | $Nb_2O_5$ | $SiO_2$ | $Nb_2O_5$ | $SiO_2$ | $Nb_2O_5$ | $SiO_2$ | $Nb_2O_5$ | $SiO_2$ | $Nb_2O_5$ | $SiO_2$ |
| Flat portion | 20 | 15 | 70 | 87.5 | 15.6 | 13.6 | 74 | 85 | 20 | 22.5 | 80 | 60 |
| Bent portion | 20 | 15 | 70 | 87.5 | 15.6 | 13.6 | 74 | 85 | 20 | 22.5 | 80 | 60 |
| Inclined portion | 20 | 15 | 70 | 87.5 | 15.6 | 13.6 | 74 | 85 | 20 | 22.5 | 80 | 60 |

TABLE 6

|  | Example 10: film configuration (nm) | | | | Example 11: film configuration (nm) | | | | Example 12: film configuration (nm) | | | |
| --- | --- | --- | --- | --- | --- | --- | --- | --- | --- | --- | --- | --- |
|  | $Nb_2O_5$ | $SiO_2$ | $Nb_2O_5$ | $SiO_2$ | $Nb_2O_5$ | $SiO_2$ | $Nb_2O_5$ | $SiO_2$ | $Nb_2O_5$ | $SiO_2$ | $Nb_2O_5$ | $SiO_2$ |
| Flat portion | 20 | 15 | 70 | 87.5 | 15.6 | 13.6 | 74 | 85 | 20 | 22.5 | 80 | 60 |
| Bent portion | 37.75 | 31.25 | 155.5 | 166.25 | 32.6 | 30.4 | 154 | 178.8 | 45 | 38.75 | 150 | 155 |
| Inclined portion | 17.75 | 16.25 | 85.5 | 78.75 | 17 | 16.8 | 80 | 93.8 | 25 | 16.25 | 70 | 95 |

The optical properties of the Examples are shown in Table 7. $\Delta L$, $\Delta a^*$, and $\Delta b^*$ in Table 7 have the following meanings. The flat portion, inclined portion, and bent portion were viewed from a vertical direction to the flat portion and examined, in respective positions, for L, $a^*$, and $b^*$ while eliminating reflection in the main surface of the substrate which was on the side opposite from the antireflection film. Differences between two points differing from each other most widely in L, $a^*$, and $b^*$ were respectively expressed by $\Delta L$, $\Delta a^*$, and $\Delta b^*$. The color difference $\Delta E$ was calculated using the equation $\Delta E=[(\Delta L)^2+(\Delta a^*)^2+(\Delta b^*)^2]^{0.5}$. As shown in Table 7, Examples 4 to 6 each satisfied $\Delta a^*<5.6$ and $\Delta b^*<5.4$ and further had a color difference $\Delta E$ in accordance with JIS Z 8729 (2004) which satisfied $\Delta E<18$. Examples 4 to 6 each hence had no unevenness in color and had a preferred appearance throughout the whole surfaces. In particular, Examples 4 and 5, in which θ was 50° or smaller, satisfied $\Delta E<5$ and had a preferred appearance.

filed on Mar. 14, 2016 (Application No. 2016-049747), the contents thereof being incorporated herein by reference.

INDUSTRIAL APPLICABILITY

It is possible to provide a curved substrate with a film which has a highly beautiful appearance and in-plane evenness and renders excellent visibility possible, a method for producing the curved substrate with a film, and an image display device.

DESCRIPTION OF THE REFERENCE NUMERALS AND SIGN

1 Curved substrate with an antiglare film
3 Curved substrate
5 Antiglare film
6 Antireflection film

TABLE 7

|  | Angle θ between flat portion and inclined portion | Thickness of film on flat portion and thickness of film on inclined portion | Thickness T of film on bent portion | $\Delta L$ | $\Delta a^*$ | $\Delta b^*$ | $\Delta E$ |
| --- | --- | --- | --- | --- | --- | --- | --- |
| Example 4 | 30° | flat portion < inclined portion | flat portion < T < inclined portion | 3.0672 | 2.2427 | 0.4486 | 3.826 |
| Example 5 | 45° | flat portion < inclined portion | flat portion < T < inclined portion | 2.1876 | 2.6531 | 0.1835 | 3.443575 |
| Example 6 | 60° | flat portion < inclined portion | flat portion < T < inclined portion | 15.323 | 5.5135 | 5.3526 | 17.14213 |
| Example 7 | 30° | flat portion = inclined portion | flat portion, inclined portion = T | 0.3997 | 5.7024 | 3.1504 | 6.527 |
| Example 8 | 45° | flat portion = inclined portion | flat portion, inclined portion = T | 4.8299 | 18.7038 | 0.6594 | 19.3286 |
| Example 9 | 60° | flat portion = inclined portion | flat portion, inclined portion = T | 32.145 | 9.3658 | 4.0039 | 33.7197 |
| Example 10 | 30° | flat portion < inclined portion | flat portion < inclined portion < T | 35.341 | 34.0082 | 46.9273 | 67.880 |
| Example 11 | 45° | flat portion < inclined portion | flat portion < inclined portion < T | 33.283 | 29.4705 | 34.4269 | 56.22698 |
| Example 12 | 60° | flat portion < inclined portion | flat portion < inclined portion < T | 18.491 | 49.461 | 58.2963 | 78.65605 |

While the invention has been described in detail and with reference to specific embodiments thereof, it will be apparent to one skilled in the art that various changes and modifications can be made therein without departing from the spirit and scope thereof. This application is based on a Japanese patent application filed on Nov. 20, 2015 (Application No. 2015-227440) and a Japanese patent application 7 Flat portion
8 Inclined portion
9 Bent portion
10 Electrostatic coating apparatus
11 Coating booth
12 Chain conveyor
13 High-voltage cable 14 Composition supply line
15 Composition recovery line
16 Air supply line
17 Electrostatic spray gun
18 High-voltage generator
19 Exhaust duct
20 Exhaust box
21 Conductive base (pedestal)
30 Gun body
31 Composition supply tube
32 Rotating shaft
33 Air outlet
35 Air supply channel
40 Rotary atomizing head
41 First member
42 Second member
43 Shaft mounting part
44 Holding part
45 Circumferential wall
46 Guide surface
47 Widening part
48 Diffusing surface
49 Front wall
50 Outflow hole
51 Cylindrical part
52 Rear wall
53 Through-hole
60 Locus of nozzle
S Reservoir chamber

The invention claimed is:

1. A curved substrate with an antiglare film, comprising:
a substrate having a first main surface, a second main surface and an end surface; and
an antiglare film provided on the first main surface, wherein:
the substrate is a glass substrate having a flat portion and a bent portion; and
a value obtained by dividing a reflected-image diffusibility index value R of the bent portion by the sum of the reflected-image diffusibility index value R of the bent portion and a reflected-image diffusibility index value R of the flat portion is 0.3 or higher and 0.8 or less:
the reflected-image diffusibility index value R is determined by irradiating the substrate with light from a direction of +45° with respect to the first main surface of the substrate as a reference (taken as 0°) to measure a luminance of regular-reflection light reflected by a substrate surface (referred to as 45° regularly reflected light), subsequently similarly irradiating the substrate with the light from the direction of +45' to measure the luminance of all reflected light reflected by the substrate surface, while changing a light-receiving angle from 0° to +90°, and calculating the reflected-image diffusibility index value R using the following equation (1):

$$\text{Reflected-image diffusibility index value } R = [(\text{luminance of all reflected light}) - (\text{luminance of } 45° \text{ regularly reflected light})]/(\text{luminance of all reflected light}) \quad (1),$$

and
wherein the curved substrate with an antiglare film further comprises a functional film provided on the antiglare film,
wherein when the flat portion, the bent portion, and another flat portion that differs in angle from the flat portion, are viewed from a vertical direction to the flat portion and examined for luminous reflectance while eliminating reflection in the second main surface, and differences between two points differing in luminous reflectance from each other most widely are expressed by $\Delta a^*$ and $\Delta b^*$, respectively, then $\Delta a^* < 5.6$ and $\Delta b^* < 5.4$ are satisfied, and the color difference $\Delta E$ in accordance with JIS Z 8729 (2004) satisfies $\Delta E < 18$.

2. The curved substrate with an antiglare film according to claim 1, wherein when the flat portion makes an angle of 50° or smaller with the another flat portion, $\Delta E < 5$ is satisfied.

3. The curved substrate with an antiglare film according to claim 1, wherein the functional film is an antireflection film.

4. The curved substrate with an antiglare film according to claim 1, wherein the functional film is an infrared cut film.

5. A display device comprising the curved substrate with an antiglare film according to claim 1.

* * * * *